US012571084B2

(12) United States Patent
Dong et al.

(10) Patent No.: US 12,571,084 B2
(45) Date of Patent: Mar. 10, 2026

(54) CORRUGATED HIGH-RESOLUTION SHADOW MASKS

(71) Applicant: The Hong Kong University of Science and Technology, Hong Kong (CN)

(72) Inventors: Shoucheng Dong, Hong Kong (CN); Jiye Yang, Hong Kong (CN); Ching Wan Tang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 683 days.

(21) Appl. No.: 17/946,083

(22) Filed: Sep. 16, 2022

(65) Prior Publication Data

US 2023/0031623 A1 Feb. 2, 2023

Related U.S. Application Data

(63) Continuation-in-part of application No. 17/244,986, filed on Apr. 30, 2021, now Pat. No. 11,638,388.

(60) Provisional application No. 63/301,495, filed on Jan. 21, 2022, provisional application No. 63/204,968, filed on Nov. 5, 2020, provisional application No. 63/101,831, filed on May 15, 2020.

(51) Int. Cl.
*H01L 51/56* (2006.01)
*C23C 14/04* (2006.01)
*C23C 14/24* (2006.01)
*C23C 16/04* (2006.01)

(52) U.S. Cl.
CPC ............ *C23C 14/042* (2013.01); *C23C 14/24* (2013.01); *C23C 16/042* (2013.01)

(58) Field of Classification Search
None
See application file for complete search history.

(56) References Cited

U.S. PATENT DOCUMENTS

| | | | |
|---|---|---|---|
| 5,868,952 A | 2/1999 | Hatakeyama et al. | |
| 7,271,094 B2 * | 9/2007 | Conrad ................. | C23C 14/042 |
| | | | 257/E21.023 |

(Continued)

FOREIGN PATENT DOCUMENTS

| | | |
|---|---|---|
| CN | 1779566 A | 5/2006 |
| CN | 103430283 A | 12/2013 |

(Continued)

OTHER PUBLICATIONS

Marc A.F. Van Den Boogaart et al., "Corrugated membranes for improved pattern definition with micro/nanostencil lithography," Sensors and Actuators A 130-131, 2006, pp. 568-574.

(Continued)

*Primary Examiner* — Jethro M. Pence
(74) *Attorney, Agent, or Firm* — Idea Intellectual Limited; Sam T. Yip

(57) ABSTRACT

A corrugated shadow mask for patterned vapor deposition includes a corrugated membrane under tensile stress with a plurality of through-apertures forming an aperture array through which a vaporized deposition material can pass. The through-apertures are at the apexes of the corrugation and project from the membrane surface surrounding the through-apertures. The shadow mask is particularly suited for forming pixel arrays for OLED displays without color mixing from adjacent pixels.

23 Claims, 21 Drawing Sheets

(56)  References Cited

U.S. PATENT DOCUMENTS

| | | | |
|---|---|---|---|
| 9,142,779 B2 | 9/2015 | Chan et al. | |
| 11,152,573 B2 * | 10/2021 | Vazan ..................... | C23C 14/24 |
| 11,638,388 B2 * | 4/2023 | Dong ..................... | G03F 7/161 |
| | | | 118/504 |
| 2003/0010749 A1 | 1/2003 | Yoshizawa et al. | |
| 2018/0315925 A1 | 11/2018 | Vazan et al. | |
| 2018/0315962 A1 * | 11/2018 | Walker .................. | B05C 21/005 |
| 2019/0360091 A1 | 11/2019 | Miyamoto et al. | |

FOREIGN PATENT DOCUMENTS

| | | | |
|---|---|---|---|
| CN | 109301081 A | 2/2019 | |
| CN | 110382161 A | 10/2019 | |
| EP | 0368089 A2 | 5/1990 | |
| JP | 2003213401 A | 7/2003 | |
| KR | 1020060082740 A | 7/2006 | |
| KR | 1020110135552 A | 12/2011 | |
| KR | 1020180022034 A | 3/2018 | |

OTHER PUBLICATIONS

International Search Report and Written Opinion of the corresponding PCT application No. PCT/CN2022/119552 mailed on Nov. 29, 2022.

* cited by examiner

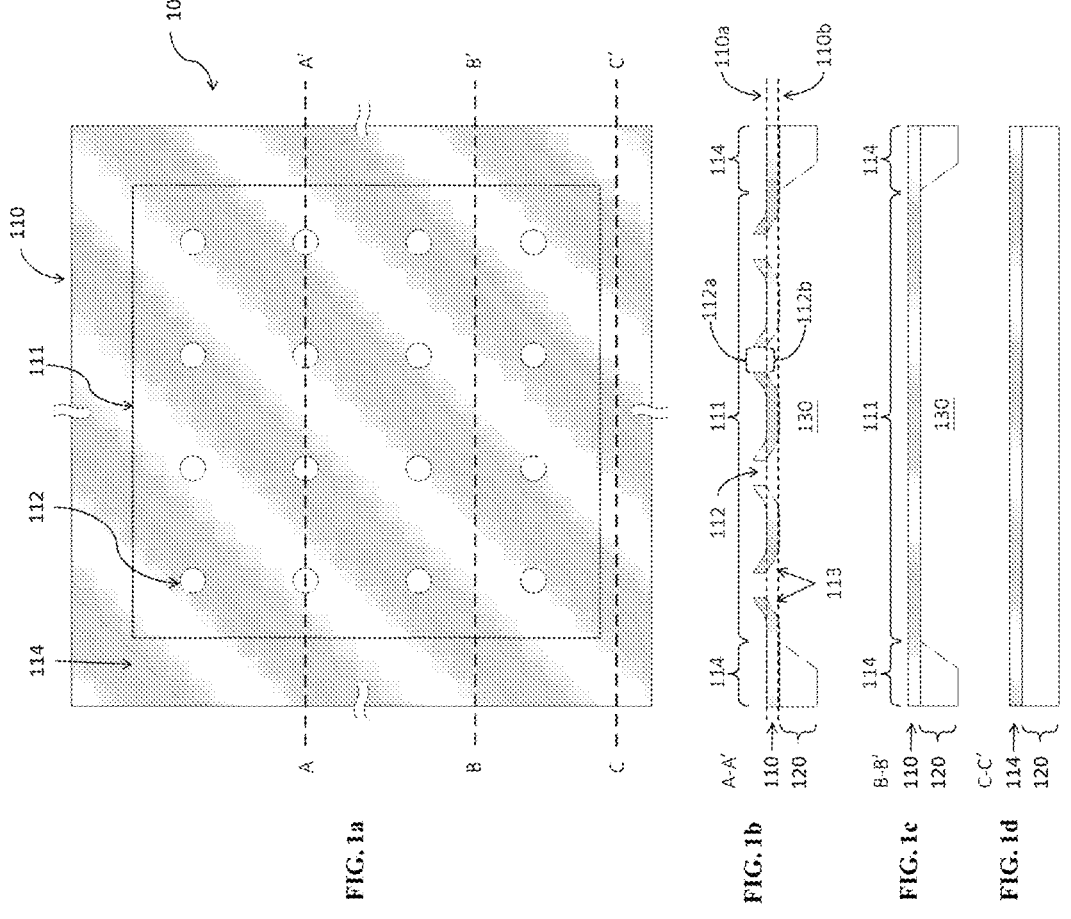

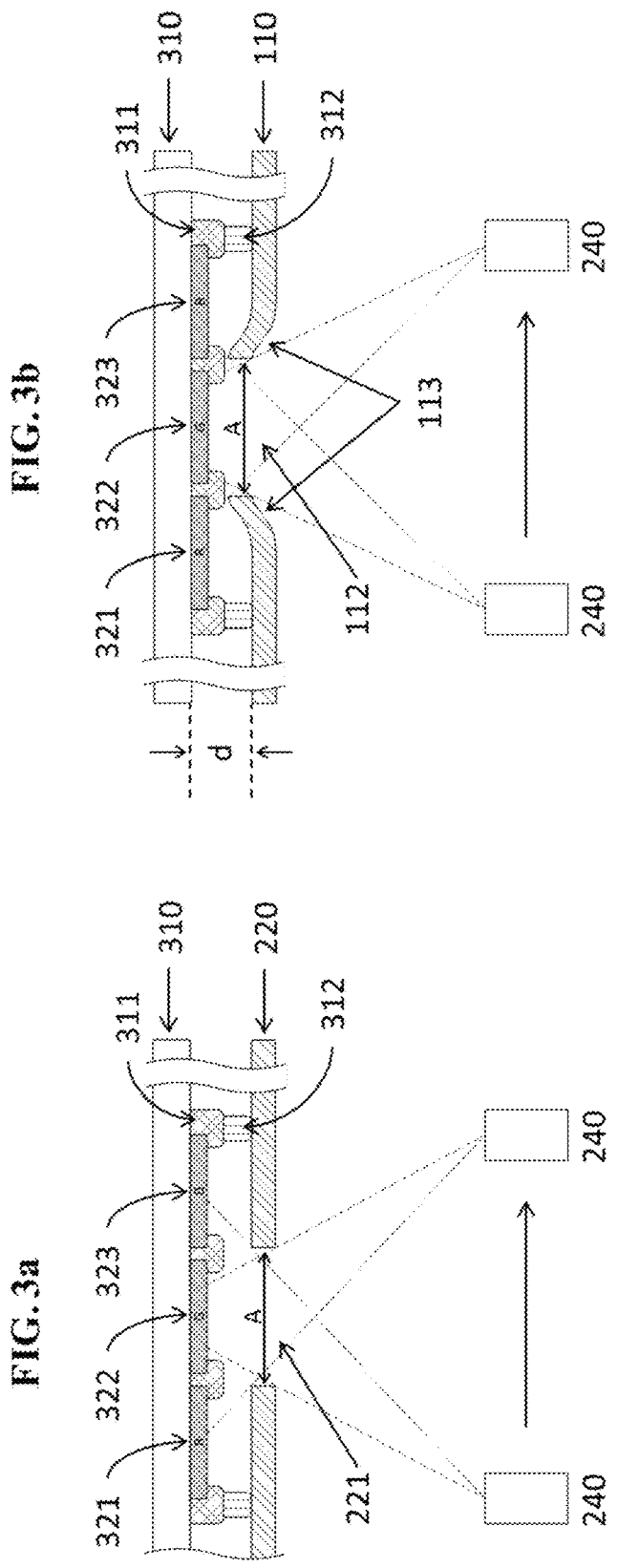

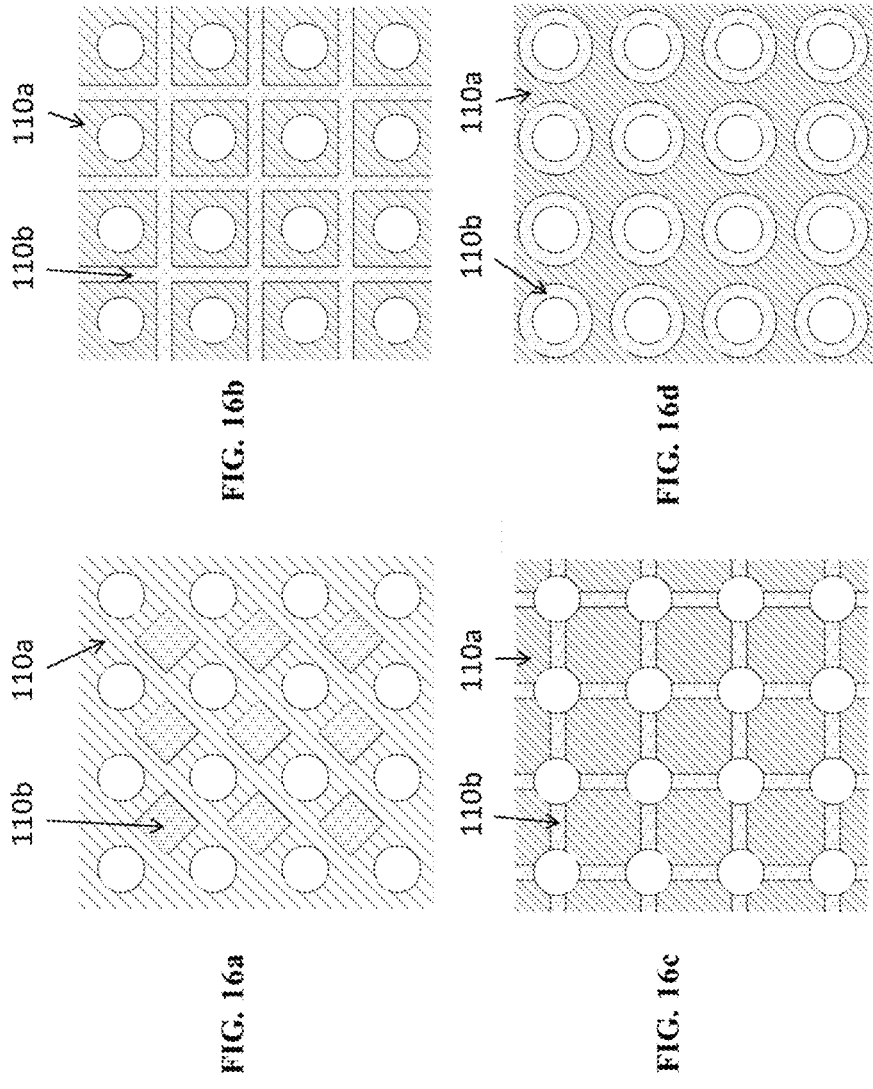

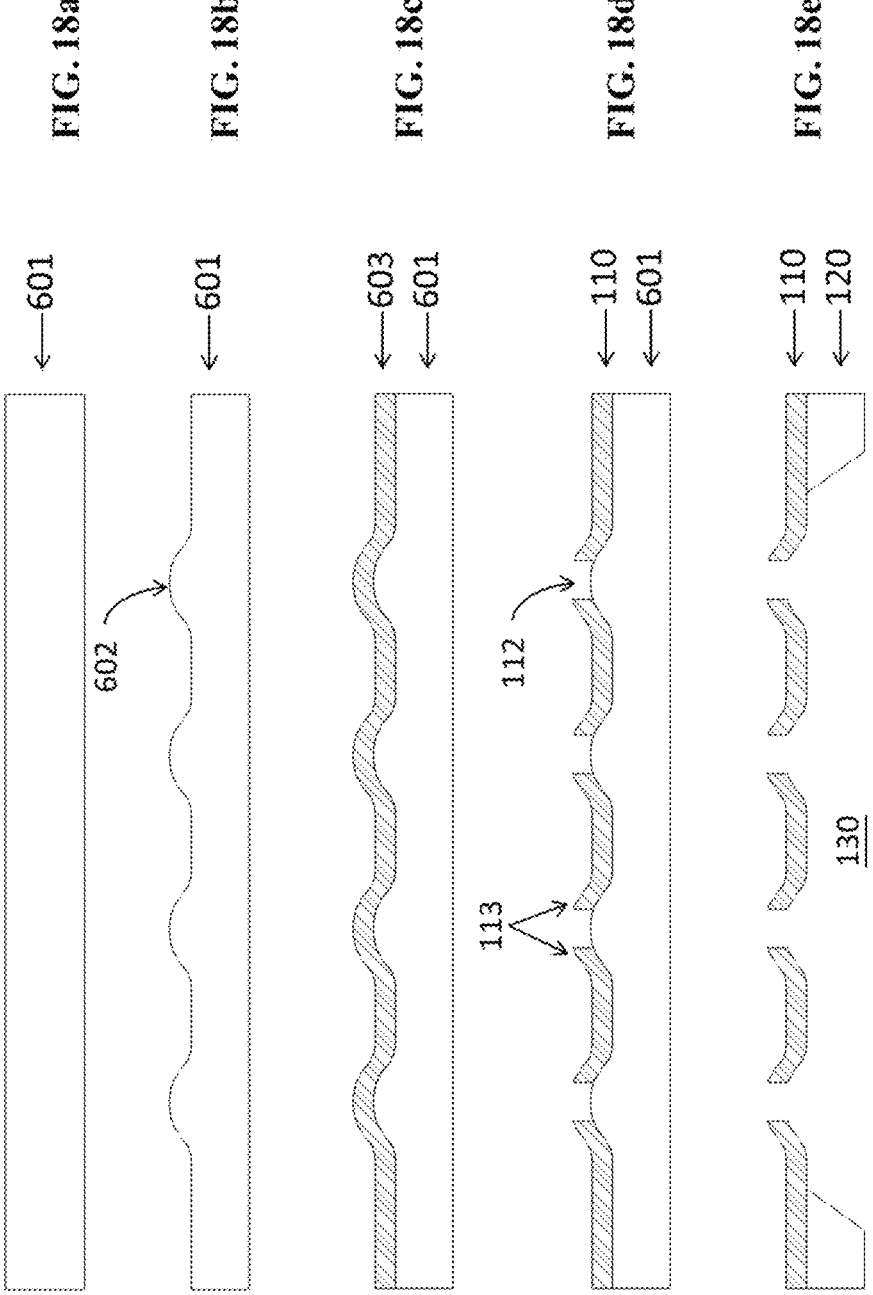

(Invention)

(invention)

CORRUGATED HIGH-RESOLUTION SHADOW MASKS

CROSS-REFERENCE TO RELATED APPLICATIONS

This application claims priority to U.S. Provisional Patent Application 63/301,495 and U.S. patent application Ser. No. 17/244,986, the disclosures of which are incorporated by reference herein.

FIELD OF THE INVENTION

The present invention generally relates to shadow masks and, more particularly, high-resolution shadow masks that can be used to produce patterned thin films by vapor deposition. The shadow masks are corrugated for reducing the shadow effect and increasing mechanical strength, and are particularly useful for the fabrication of high-resolution organic light-emitting diode (OLED) displays.

BACKGROUND OF THE INVENTION

OLED displays with side-by-side RGB pixel configurations, such as those used in smartphones and VR/AR goggles, are predominantly produced by vacuum thermal evaporation (VTE) through a fine metal mask (FMM) comprising a stretched thin metal foil with multiple through-apertures. In this process, the emitting layer of the OLED display is deposited by VTE onto the electronic backplane of the display through the FMM to form an array of color subpixels. By repeating the process, a full-color OLED display is produced with all three arrays of RGB subpixels aligned side-by-side on the electronic backplane. Consequently, the resolution of the OLED display produced by a FMM is defined by the density of the apertures in the FMM.

In general, the aperture density of conventional FMMs has been limited to under 1000 apertures per inch (ppi) due to the shadowing effect caused by the finite thickness of the metal foil, which is typically over 10 µm. With these FMMs, OLED displays with a pixel resolution in the range of 400 to 600 ppi can be produced and are sufficient for use in smartphones. However, this pixel resolution is far from satisfactory in near-eye applications such as virtual reality (VR) and augmented reality (AR). To avoid the screen-door effect, where individual pixels on the display become visible to the human eye, the display for VR/AR devices should have a pixel resolution of 2000 ppi or higher. However, it is exceedingly difficult to produce OLED displays beyond 1000 ppi to meet the VR/AR applications due to the intrinsic limitation of the metal foil based FMM.

As an alternative to FMM, silicon nitride-based shadow masks were produced and disclosed in U.S. Pat. No. 9,142,779 for patterning OLED displays. These shadow masks comprise a solid silicon frame with a free-standing silicon nitride (SiNx) membrane stretched on the frame. The SiNx membrane, about one micron thick, has a high density of apertures patterned on it by photolithography. Owing to the much-reduced (by an order of magnitude) mask thickness compared to FMM, the aperture density achievable by this SiNx mask can be significantly increased to more than 2000 ppi. However, the SiNx mask technology has its own limitations.

Commercial display backplanes have microscopic topological features functioning as spacers in areas between pixels. When the backplane and the shadow mask are brought into contact during VTE, these topological features establish a gap between the backplane and the shadow mask to specifically protect the designated OLED areas on the backplane from mechanical damage caused by mask chucking. In addition, they prevent the shadow mask from sticking to the backplane during detachment. Such a gap is typically a few microns, a value insignificant when an FMM is used but increasingly relevant when the pixel dimensions are reduced to less than 10 microns using ultrathin masks such as silicon nitride membranes. The flat silicon nitride mask disclosed in U.S. Pat. No. 9,142,779 cannot reduce this gap, limiting its ability to alleviate the shadow effect and pattern ultrahigh-resolution OLED displays.

The free-standing silicon nitride membrane also relies on its intrinsic tensile stress to maintain its flatness with respect to the supporting silicon frame. However, this same tensile stress also induces a force pulling the silicon frame inward and causing a curvature in the mask. This can widen the gap between the mask and the display substrate, leading to registration and alignment errors between the two and significant offsets and non-uniformity in the deposition patterns. This problem scales with the size of the shadow mask. Consequently, the techniques described in U.S. Pat. No. 9,142,779 are generally limited to shadow masks with a silicon nitride membrane of less than one inch in the diagonal dimension.

Additionally, the silicon nitride shadow mask in U.S. Pat. No. 9,142,779 cannot accommodate RGB-stripe pixel arrangements, as the flat silicon membrane tends to sag along the long side of the stripe apertures, where the aperture ratio is the highest. This sag also creates an unwanted gap between the mask and the substrate. The sag increases, widening the gap, as the aperture ratio along the long side of the aperture increases and the membrane's size expands.

M. A. F. van den Boogaart et al. (Sensors and Actuators A 130-131 (2006) 568-574), describe a corrugated structure applied to a silicon nitride shadow mask to strengthen the mask mechanically and prevent the mask membrane from sagging. However, in this mask, the apertures do not protrude from the membrane surface. As a result, the corrugations cannot reduce the mask-substrate gap established by mask distortion or photospacers.

Thus, there is a need in the art for improved shadow masks for vapor deposition. The present invention addresses this need.

SUMMARY OF THE INVENTION

A shadow mask for patterned vapor deposition comprises a corrugated membrane mounted on a peripheral support. The corrugated membrane includes a central membrane region and a peripheral membrane region surrounding the central membrane region. The central membrane region has a plurality of through-apertures forming an aperture array through which a vaporized material can pass, each aperture including an exit opening at the top surface of the membrane and an entrance opening at the bottom surface of the membrane, such that vaporized material will pass through the shadow mask from the entrance openings to the exit openings. The central membrane region has corrugations, with through-apertures situated at the apex of the corrugation. The corrugated membrane includes a base membrane plane, where the apex of each corrugation projects beyond the surrounding base membrane plane. The peripheral membrane region, which surrounds the central membrane region, has a peripheral support attached to its rear surface. The peripheral support has a hollow portion beneath the central membrane region. Advantageously, the shadow masks of the present invention differ from conventional shadow masks, metallic or ceramic, in having a corrugated top surface with protruding through-apertures instead of a flat top surface with in-plane through-apertures.

In another aspect, the present invention provides a method for making the shadow mask. The method includes providing a shadow mask blank with a flat top surface. Corrugations are formed on the blank's top surface, and a membrane is further formed on the corrugated blank. A shadow mask pattern of perforations is etched in the membrane to define a patterned central membrane region with through-apertures situating at the apexes of the corrugations and an un-patterned peripheral membrane region. The blank is removed in a region beneath the central membrane region such that a shadow mask is formed with an unsupported patterned central membrane region, a supported un-patterned peripheral membrane region, and a peripheral support beneath the peripheral membrane region.

Advantageously, the shadow masks of the present invention exhibit a reduced shadow effect, which is crucial for achieving micron-scale patterning. The corrugations on the membrane produce elevated through-apertures that can further narrow the gap between the apertures' exit openings and the display substrate during material deposition, resulting in a smaller shadow distance and thus avoiding color mixing between adjacent subpixels.

Another advantageous feature of the invention is that the disclosed shadow mask has a free-standing membrane with improved mechanical strength against deflection or distortion, allowing the membrane to be scaled to large dimensions without breaking while maintaining long-range flatness. The corrugations in the membrane directionally enhance its rigidity and enable large aperture ratios along preferred directions without compromising the overall flatness of the mask.

In one aspect, the present invention provides a shadow mask for patterned vapor deposition. The mask includes a corrugated membrane having a central membrane region including plural periodic corrugations; each corrugation has an apex that projects beyond surrounding membrane regions. Each apex includes a through-aperture forming an aperture array in the corrugated membrane central region through which a vaporized deposition material can pass. A peripheral membrane region surrounds the central membrane region and includes a peripheral support attached to a rear surface of the peripheral membrane region. A hollow portion is positioned beneath the central membrane region.

In a further aspect, the corrugated membrane may be ceramic, metallic, elemental, or polymeric in nature.

In a further aspect, the corrugated membrane is ceramic.

In a further aspect, the corrugated ceramic membrane includes one or more of silicon nitride, silicon oxide, or silicon oxynitride.

In a further aspect, the peripheral support includes one or more of single crystalline silicon, polycrystalline silicon, quartz, glass, polymer, or metal.

In a further aspect, the peripheral support is a multilayer peripheral support.

In a further aspect, the multilayer support includes at least a first layer that includes single crystalline silicon, polycrystalline silicon, quartz, glass, polymer, or metal.

In a further aspect, the multilayer support includes a second layer beneath the first layer that includes silicon nitride, silicon oxynitride with an atomic ratio of oxygen less than 30%, aluminum oxide, metal, or polymer.

In a further aspect, the multilayer support includes a third layer above the first layer that includes silicon nitride, silicon oxynitride with an atomic ratio of oxygen less than 30%, aluminum oxide, metal, or polymer.

In a further aspect, the thickness of the corrugated membrane is 10 microns or less.

In a further aspect, the thickness of the corrugated membrane is 5 microns or less.

In a further aspect, the central membrane region is approximately rectangular in shape and a length of a diagonal is approximately 2 cm or more.

In a further aspect, the plural periodic corrugations are approximately sinusoidal, rectangular waveform, trapezoidal waveform, or triangular waveform in shape.

In a further aspect, the periodic corrugations are on a top surface.

In a further aspect, the corrugated membrane is a multilayer corrugated ceramic membrane.

In a further aspect, the multilayer corrugated ceramic membrane includes first and second ceramic layers including silicon nitride, silicon oxide, or silicon oxynitride, and a polymeric or metallic interlayer between the first and second ceramic layers.

In a further aspect, the corrugated membrane central membrane region further includes a set of additional corrugation in membrane regions between adjacent apertures.

In another aspect, the present invention provides a method for making the shadow mask. A corrugated surface is formed on a base substrate. One or more membrane layers are deposited on the corrugated surface of the base substrate. Apertures are patterned in the membrane layers at apexes of the corrugations. A portion of the base substrate is removed beneath a central region of the membrane layer to form an unsupported central region and a supported peripheral region.

In another aspect, the method for making the mask includes forming the corrugated surface on the base substrate by etching.

In another aspect, the method for making the mask includes depositing the one or more membrane layers on the corrugated surface of the base substrate by chemical vapor deposition or plasma-enhanced chemical vapor deposition.

In another aspect, the method for making the mask includes forming the apertures by reactive ion etching, deep reactive ion etching, or wet etching.

In another aspect, the method for making the mask includes removing the portion of the base substrate by wet etching or deep reactive ion etching.

BRIEF DESCRIPTION OF THE DRAWINGS

FIGS. 1a-1d schematically depict a shadow mask according to an embodiment. FIG. 1a is a top view of the mask; FIG. 1B is a cross-section of the mask taken along line A-A' of FIG. 1a; FIG. 1c is a cross-section of the mask taken along line B-B' of FIG. 1a; FIG. 1d is a cross-section of the mask taken along line C-C' of FIG. 1a.

FIGS. 3a-3b compare the patterning of color subpixels between shadow masks without and with corrugations.

FIGS. 12a and 12c show the shadow mask having the membrane deflected under external force.

FIGS. 16a-16d schematically exemplify the arrangements of the interlayer 110b on top of the first ceramic layer 110a when 110b partially covers the surface of 110a.

FIGS. 18a-18e are a process flow of the disclosed method for making the corrugated shadow mask.

DETAILED DESCRIPTION

Figure 2B:
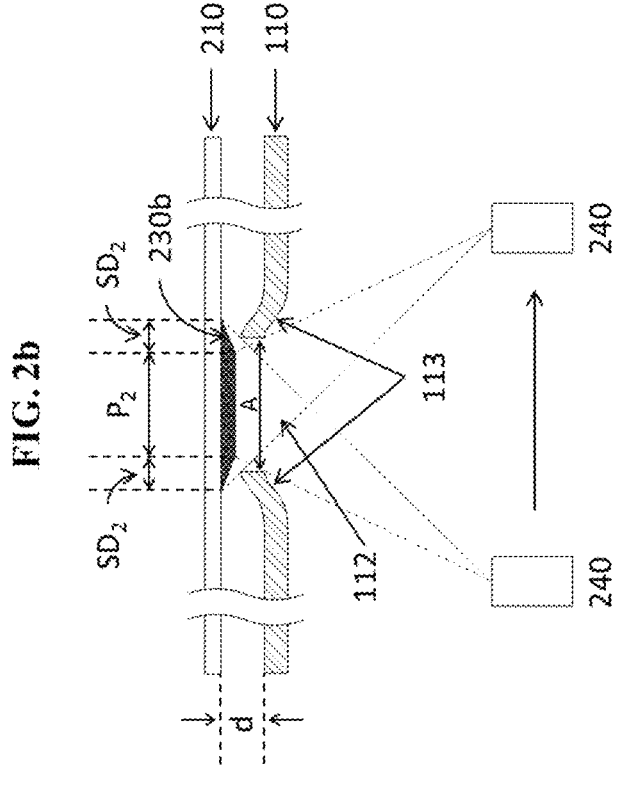
FIGS. 2a-2b show the shadowing effect of shadow masks without and with corrugations.

The present invention describes a shadow mask for the patterning of vapor-deposited thin films and methods of making the masks. In an embodiment, the thin films to be patterned are used in OLED devices. Turning to the drawings in detail, FIGS. 1a-1d depict a shadow mask according to an embodiment of the present invention.

In one aspect, the present invention provides a shadow mask 100 having a corrugated membrane 110 and a rigid peripheral support 120. The corrugated membrane 110 includes a central membrane region 111 with a plurality of through-apertures 112, forming an aperture array through which a vaporized deposition material can pass. The membrane 110 includes corrugations 113 with the through-apertures 112 situated at the apexes of each corrugation. As seen in FIG. 1B, each through-aperture 112 has an exit opening 112a at an apex of a corrugation surrounded by the top surface of membrane 111 and an entrance opening 112b surrounded by the bottom surface of membrane 111. As used herein, the term "apex" relates to a relative maximum height/peak projection as seen, for example in the cross-section of FIG. 1B, that extends beyond the non-corrugated portions in between adjacent apexes as defined by the base membrane planes 110a, b, explained below. The top surface of the flat portion (areas without corrugations) of membrane 110 establishes an upper membrane plane 110a, and the bottom surface of the flat portion of membrane 110 establishes a lower membrane plane 110b. The lower membrane plane 110b also aligns with the top surface of the peripheral support 120. Parts of the corrugated membrane 111, including the exit opening 112a, project beyond the upper membrane plane 110a—these include the highest project, that is, the apexes, 112. In some embodiments, the upper edge of the exit opening 112a projects beyond the upper membrane plane 110a, and the lower edge of entrance opening 112b projects beyond the lower membrane plane 110b. In some embodiments, both the upper edge of exit opening 112a and lower edge of entrance opening 112b project beyond the upper membrane plane 110a. In some embodiments, the upper edge of exit opening 112a projects beyond the upper membrane plane 110a, and the lower edge of entrance opening 112b does not project beyond the lower membrane plane 110b. Vaporized material will pass the shadow mask from the entrance openings 112b to the exit openings-112a. In this manner, the upper edge of each exit opening 112a is elevated from its adjacent membrane regions and beyond the upper membrane plane 110a. By positioning the exit opening 112a at the apex of the corrugation, the gap between the apertures' exit openings and the display substrate is narrowed during material deposition, resulting in a smaller shadow distance and thus avoiding color mixing between adjacent subpixels.

Surrounding the central membrane region 111 is a peripheral membrane region 114 that does not include through-apertures. As seen in FIGS. 1B-1d, a multilayer peripheral support 120 is attached to a rear surface of the peripheral membrane region 114. The central membrane region 111 is free-standing/unsupported by the peripheral support 120; that is, the peripheral support 120 incudes a hollow portion 130 beneath the central membrane region 111.

In one aspect, the membrane 110 may be ceramic, metallic, elemental, or polymeric in nature. Membrane 110 may include one or more of silicon nitride, silicon oxide, silicon oxynitride, Fe—Ni alloy, silicon (amorphous, polycrystalline, or single crystalline), or polyimide. In an embodiment, membrane 110 is ceramic. Membrane 110 may be a silicon nitride, silicon oxide, or silicon oxynitride thin layer with a thickness of approximately 5 microns or less and under tensile stress. The peripheral support 120 may be one or more of silicon, silicon oxide, silicon nitride, silicon oxynitride, aluminum oxide, aluminum nitride, amorphous silicon, polycrystalline silicon, nickel, iron, nickel-iron alloy, or polymer. Membrane 110 is tensioned by its tensile stress over the hollow portion 130 between peripheral support portions 120. The tensile stress level may be optionally tuned based on the selected composition. When the membrane 110 includes silicon nitride, for example, its tensile stress can be tuned by using non-stoichiometric compositions, optional dopants and dopant concentrations, and fabrication techniques. In some embodiments, the thickness of the membrane 110 is selected to be approximately 2 microns or less. Each aperture 112 includes at least one aperture dimension that is less than approximately 10 microns such that small pixel sizes may be created using the shadow masks of the present invention.

The corrugations 113 of membrane 110 position each aperture's exit opening 112a closer to the deposition substrate and away from a membrane area surrounding the exit opening 112a and from the upper membrane plane 110a. In some embodiments, corrugations 113 may have a periodic structure such that the cross-section of each corrugation approximately follows a sinusoidal, rectangular, trapezoidal, or triangle waveform in whole or in part. In some embodiments, membrane areas without apertures, such as the peripheral membrane region 114 and the non-perforated areas in the central membrane region 111, may also be corrugated. In some embodiments, the height of the corrugation at its apex, characterized by the perpendicular displacement between the corrugation's highest point and lowest point, is 10 microns or less. In some embodiments, only the top surface of membrane 110 is corrugated, while the bottom surface of membrane 110 is flat with the entrance opening 112b of the aperture 112 staying in the lower membrane plane 110b.

Figure 2A:
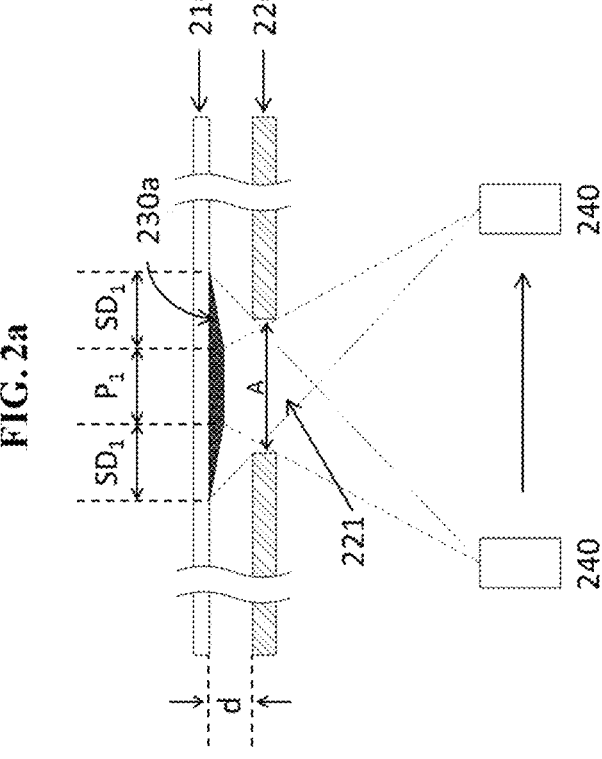

The corrugated membrane 110 in shadow mask 100 has elevated apertures that are positioned closer to the display backplane/substrate during vapor deposition and produce sharper material patterns than apertures in a shadow mask without corrugation. FIGS. 2a and 2b illustrate the favorable effect of such elevation.

In FIG. 2a, a deposition substrate 210 is placed in the proximity of a flat shadow mask 220 with a gap d between the two. In display panel manufacturing, such a gap may be intentionally introduced using geometrical spacers per process requirements or unintentionally caused by the distortion of the mask or the display backplane. The shadow mask 220 is without corrugation and has in-plane through-apertures 221 with an opening spacing of A. When a line-of-sight deposition source 240 moves from left to right under the mask 220, similar to a linear source scanning a display backplane in OLED mass production, a material film 230a is deposited on the substrate 210 through the through-aperture 221. The dashed lines indicate the range of vaporized materials that can pass through aperture 221 to reach substrate 210. Due to the shadow effect of the gap d and the thickness of the mask 220, deposited film 230a has a central region that is relatively uniform in thickness and suitable for forming OLED pixels and a peripheral region that is not uniform in thickness and not usable for fabricating OLED devices. The width of the peripheral region, known as the shadow distance, is denoted as $SD_1$, and the width of the usable central region is denoted as $P_1$.

In the embodiment of FIG. 2b, a corrugated shadow mask membrane 110 is configured between the deposition substrate 210 and deposition source 240 in the same manner as in FIG. 2a. The gap between 210 and 110 and the width of through-aperture 112 are the same as the gap between 210 and 220 and the width of 221 in FIG. 2a, respectively. The deposited film 230b has a uniform, central region with a width of $P_2$ and a non-uniform, peripheral region with a width of $SD_2$. Due to the corrugation 113 in membrane 110, the aperture 112 is elevated and closer to substrate 210 than 221. As a result, the shadow distance $SD_2$ is smaller than $SD_1$, and the uniform film width $P_2$ is larger than $P_1$ and closer to the width of the opening spacing A than $P_1$. Overall, deposited film 230b exhibits a more uniform morphology and smaller shadow distance than deposited film 230a, meaning the corrugated mask 110 can increase the active pixel area and reduce the shadow effect.

The embodiment in FIG. 3 further demonstrates how the effect of the corrugated membrane is manifested in practical OLED display manufacturing, where a gap is intentionally established between the shadow mask and the display backplane through microscopic projections on the backplane. These projections, also known as photospacers, are positioned between active pixel areas as part of a planarization layer, a pixel defining layer, or a bank structure. When a shadow mask is brought into contact with the display backplane during material deposition, these projections serve as contact points for the shadow mask and protect the backplane from mechanical damages incurred by mask chucking, such as fracture, indentation, and delamination. When the shadow mask is detached from the display backplane after material deposition, these projections also help prevent the mask from sticking to the backplane, avoiding further damages. In FIGS. 3a and 3b, a display backplane 310 is placed in contact with a flat shadow mask 220 (FIG. 3a) and a corrugated shadow mask membrane 110 (FIG. 3b), respectively, through projections 312. Backplane 310 includes electrodes for red 321, green 322, and blue 323 subpixels, a pixel-defining layer 311 between these electrodes, and projections 312 on pixel-defining layer 311. The dashed lines from the deposition source 240 indicate the range of vaporized materials that can pass through the respective shadow masks 220 and 110 to reach display backplane 310. The gap d and the aperture width A are the same in FIGS. 3a and 3b and the through-apertures 221 and 112 are placed directly under the green subpixel of 310 for patterning green OLED materials. In FIG. 3a, the vaporized material from source 240 can reach the adjacent red and blue subpixel due to the gap d, while in FIG. 3b, the vaporized material is restricted only to the green subpixel due to the elevated aperture 112 at the apex of a corrugation 113. In addition to increasing the active pixel area and reducing the shadow effect, the corrugated shadow mask 110 can also avoid color mixing in the production of OLED displays with RGB side-by-side configurations as seen in FIG. 3b.

Figure 4:
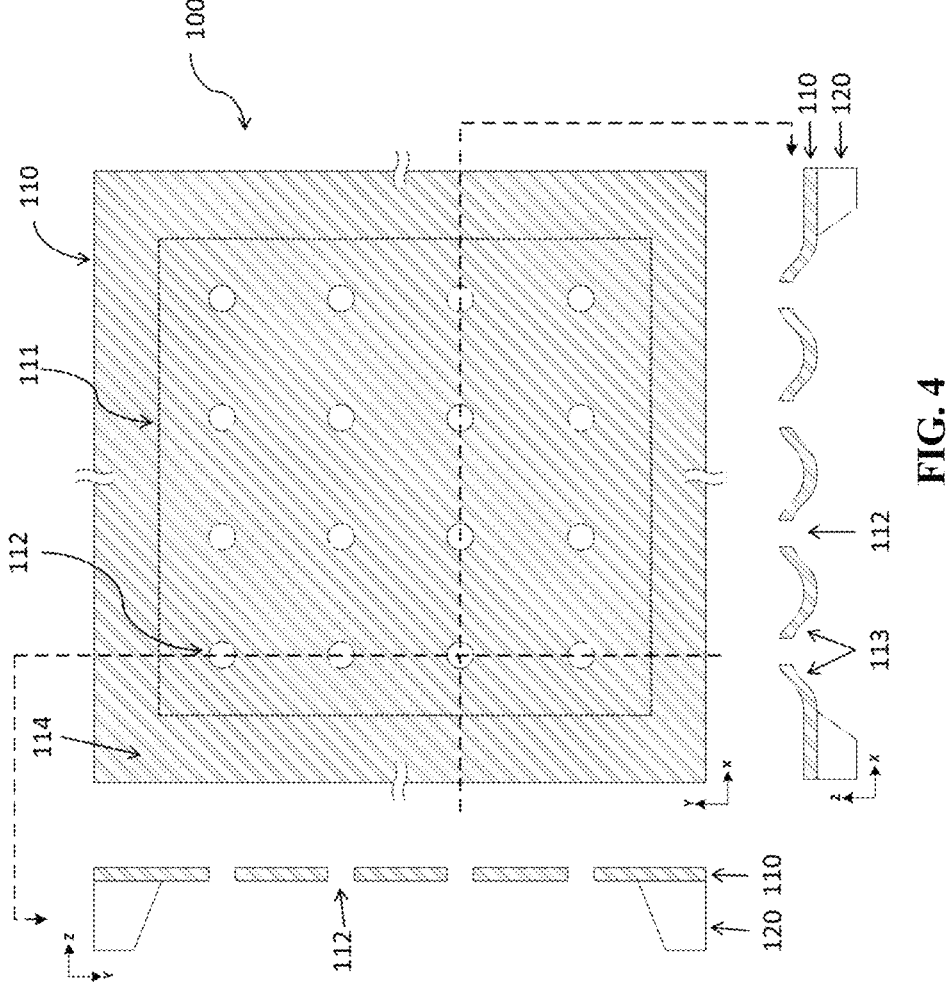
FIG. 4 schematically depicts a shadow mask according to an embodiment with corrugation propagating along the x-axis of the shadow mask. The dashed lines with an arrow indicate cross-sectional views of corresponding sections.
Figure 5:
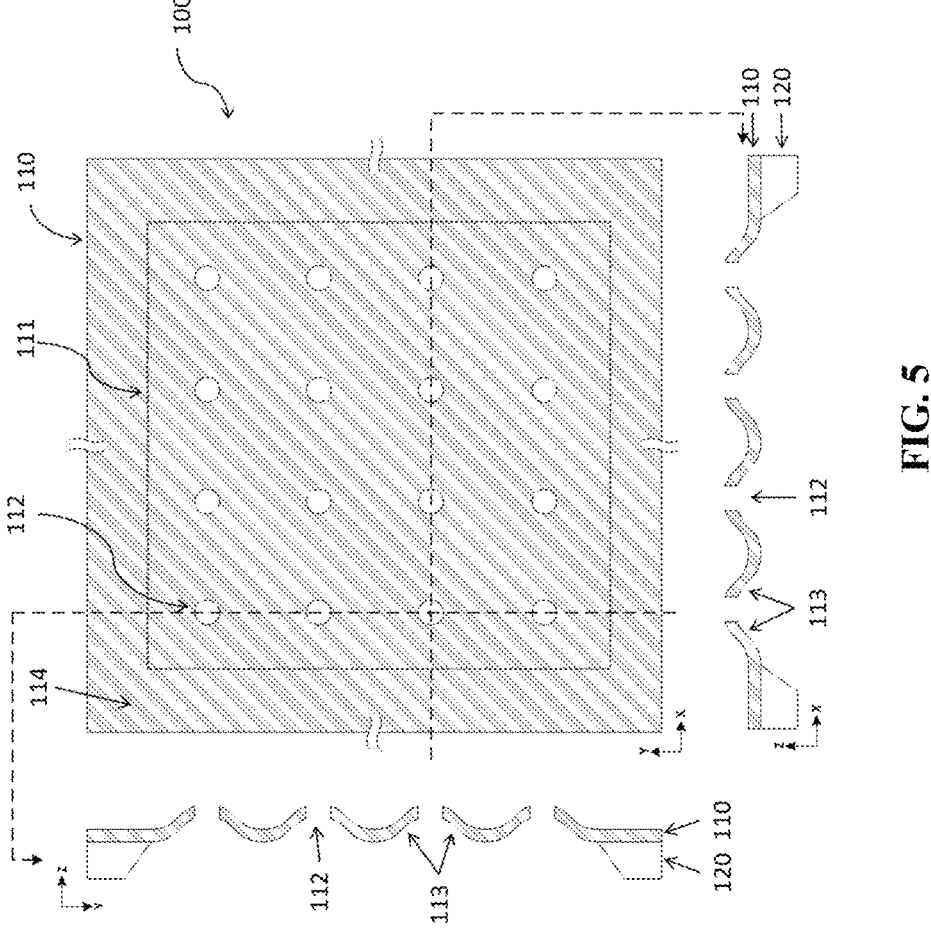
FIG. 5 schematically depicts a shadow mask according to an embodiment with corrugation propagating along both the x-axis and y-axis of the shadow mask. The dashed lines with an arrow indicate cross-sectional views of corresponding sections.

The corrugated shadow mask 100 also has enhanced mechanical strength compared to a flat-surface shadow mask. Much like a corrugated fiberboard, the rigidity of the mask membrane can be directionally increased by corrugation. As shown in FIG. 4, a corrugated mask 100 has a sinusoidal corrugation 113 propagating along the x-axis of the membrane 110 and shows enhanced mechanical strength along its y-axis. Likewise, in FIG. 5, a corrugated mask has sinusoidal corrugations 113 along both axes of the membrane 110 and shows enhanced strength in both directions. The corrugation in the disclosed shadow masks may follow various waveforms, including sinusoidal, rectangular, trapezoidal, and triangular, in whole or in part, mixed or transformed, along any cross-section of the membrane. The corrugation along different directions of the membrane may follow different waveforms. The through-apertures are preferably perforated at the apexes of each corrugation.

Figure 6:
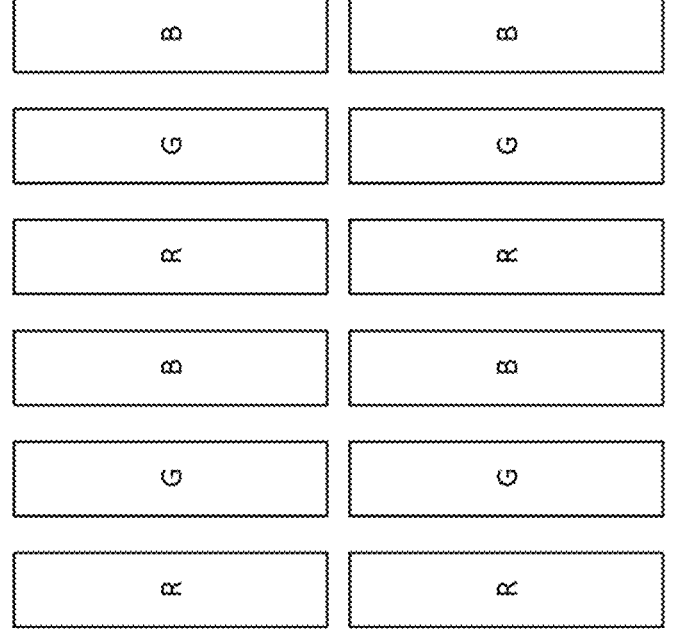
FIG. 6 depicts the schematic layout of the RGB-stripe pixel arrangement.

This mechanical strengthening through corrugation is particularly useful in reinforcing shadow masks with large differences in aperture ratios along different directions, as the mask membrane is weaker along directions with higher aperture ratios and demonstrates an increased tendency to sag. One such case is shadow masks for RGB-stripe pixel arrangement, one of the most common and desirable full-color pixel configurations in displays. As shown in FIG. 6, each subpixel in the RGB-stripe arrangement is approximately a rectangle with a large aspect ratio, and subpixels of the same color from different rows are aligned vertically. As a result, in a shadow mask for RGB stripes, the aperture ratio of each aperture column is larger than that of each aperture row. Consequently, such disparity will lead to anisotropic stress distribution in the membrane and cause the mask to sag, particularly along the direction with a higher aperture ratio. The larger the mask, the deeper such sag.

Figure 7:
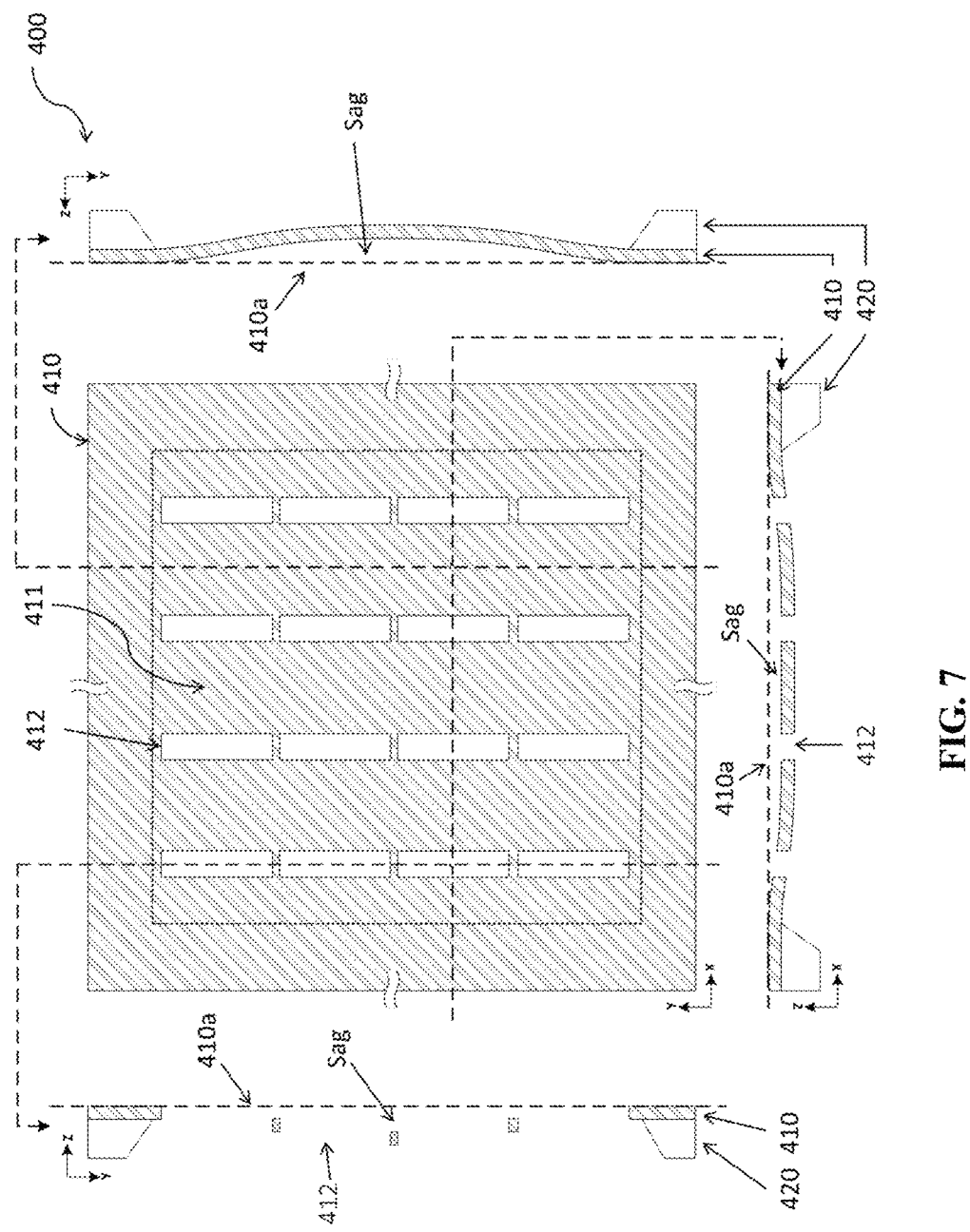
FIG. 7 schematically depicts a shadow mask according to an embodiment with elongated apertures for patterning RGB-stripe pixels. The dashed lines with an arrow indicate cross-sectional views of corresponding sections.

As shown in FIG. 7, a flat-membrane RGB-stripe shadow mask 400 has a flat membrane 410 with through-apertures 412 and a peripheral support 420. The membrane area 411 between two aperture columns is essentially a long, thin strip tethered only by its two ends and narrow areas between aperture rows and, therefore, will sag substantially along the y-axis. Such phenomenon has been previously observed in U.S. Pat. No. 9,142,779. In the prior art, solutions to this problem are: 1) reducing the aspect ratio and the aperture ratio of RGB-stripe subpixels; 2) using a pixel geometry with a lower directional aperture ratio disparity, such as pentile and triangular arrangement; 3) adding rigid supporting beams underneath the shadow mask along the direction with a higher aperture ratio. Each one of these solutions has clear disadvantages and limitations.

Figure 8:
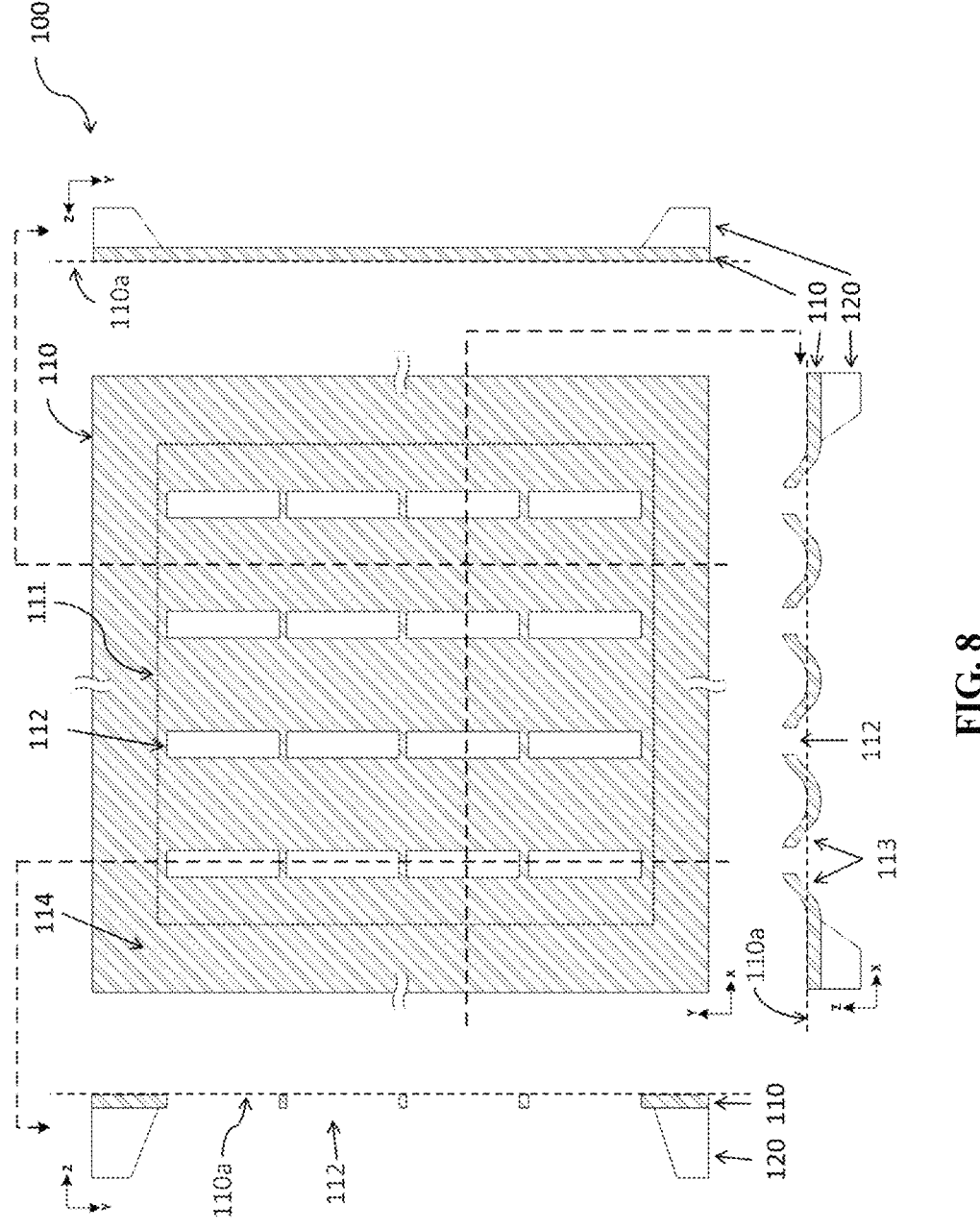
FIG. 8 schematically depicts a flat shadow mask with elongated apertures for patterning RGB-stripe pixels. The dashed lines with an arrow indicate cross-sectional views of corresponding sections.
Figures 9A, 9B, 9C, 9D, 9E:
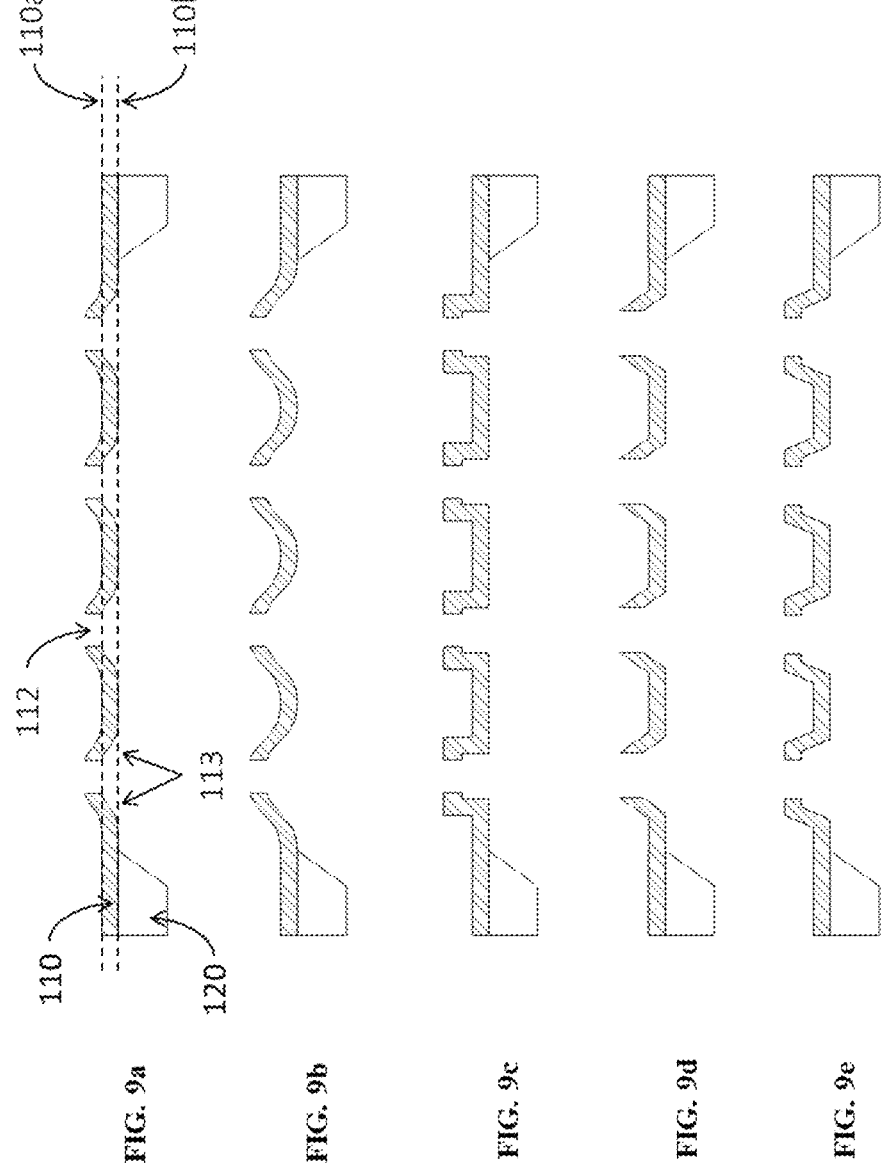
FIG. 9a-9e schematically depicts the cross-sectional views of shadow masks with various corrugation waveforms.

Compared to these techniques, the present invention achieves a high-aperture ratio shadow mask for patterning RGB-stripe pixel arrangement in high-resolution OLED displays. When the mask membrane is selectively corrugated, such as the shadow mask 100 with a sinusoidal corrugation 113 propagating along the x-axis in FIG. 8, the center membrane 111 will demonstrate higher rigidity along the y-axis where the aperture ratio is the highest, reducing the sag. As a result, the overall flatness of the shadow mask is improved, even when the mask is extended to large areas.

Figures 20A, 20B:
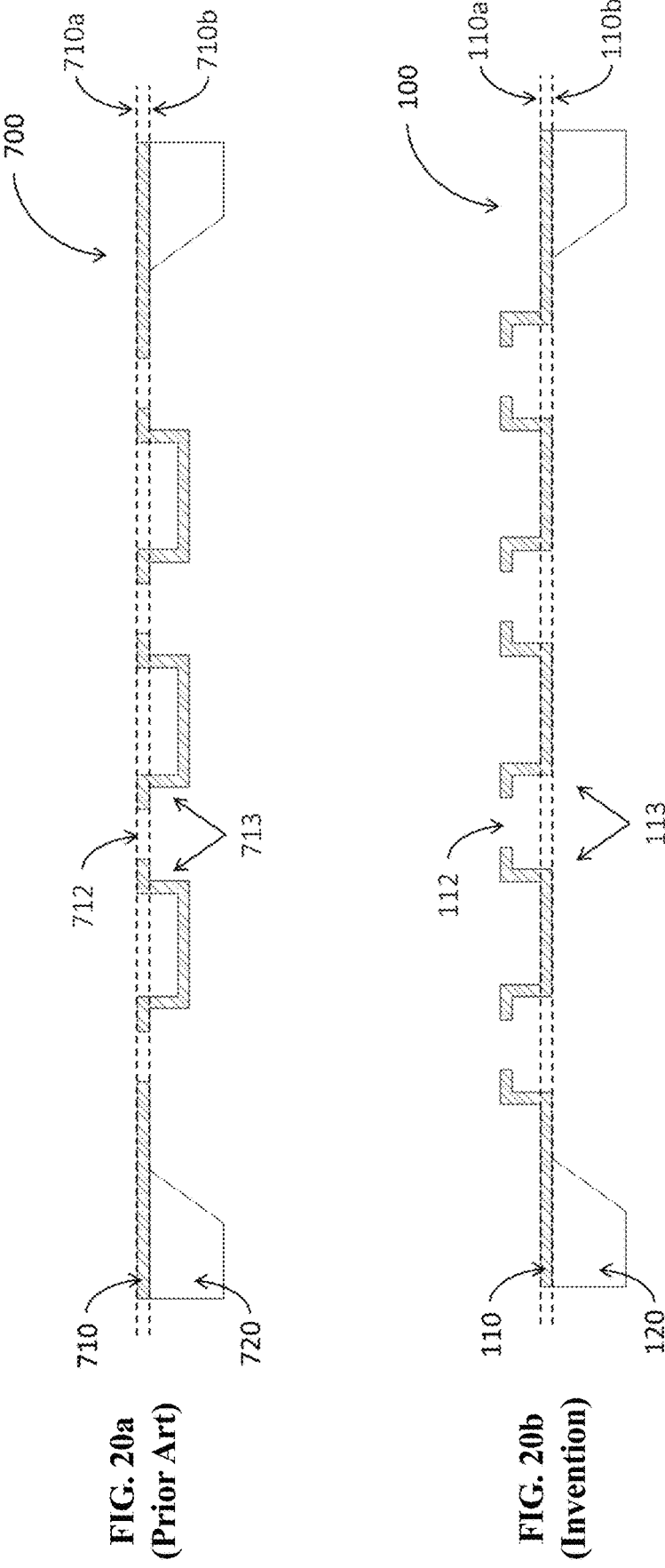
FIGS. 20a and 20b depict a prior art membrane compared to a mask according to the present invention.

In the prior art, M. A. F. van den Boogaart et al. (Sensors and Actuators A 130-131 (2006) 568-574), a corrugated structure was applied to a silicon nitride shadow mask to strengthen the mask mechanically and prevent deflection. FIG. 20a shows a general structure of the corrugated mask 700 in the prior art. The corrugated membrane 710 is supported by frame 720 and has an upper membrane plane 710a established by the top surface of the flat portion of the membrane 710 and a lower membrane plane 710b established by the bottom surface of the flat portion of the membrane 710. Parts of membrane 710 are recessed from the surrounding membrane areas by the corrugation 713, and the apertures 712 do not project beyond the upper membrane plane 710a. This structure can increase the mechanical strength of membrane 710 but cannot reduce the gap between the mask and a deposition substrate. Aperture 712 remains within upper membrane plane 710a and lower membrane plain 710b, just like a conventional flat-surface mask without corrugations.

In comparison, the corrugated shadow mask 100 of the present invention, as depicted in FIG. 20b, has corrugations that elevate parts of the membrane 110 from the surrounding membrane areas, such that the apertures 112 project beyond the upper membrane plane 110a. As a result, the gap between the mask and a deposition substrate is reduced while the mechanical strength of membrane 110 is increased.

Figure 21A:
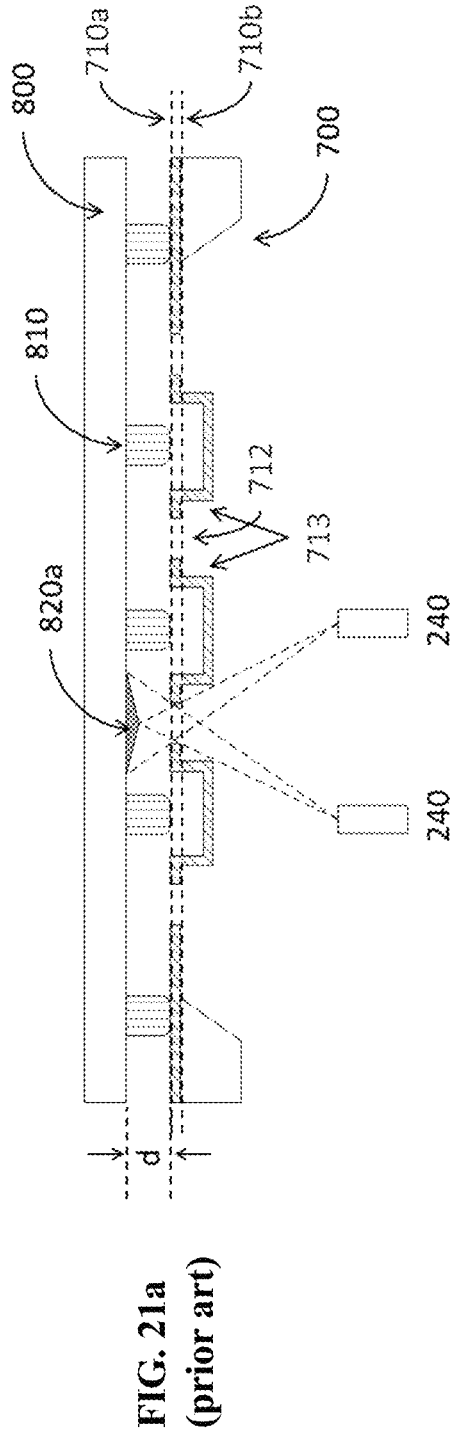
FIGS. 21a and 21b compare vapor deposition through a prior art mask and through the shadow mask of the present invention.
Figure 21B:
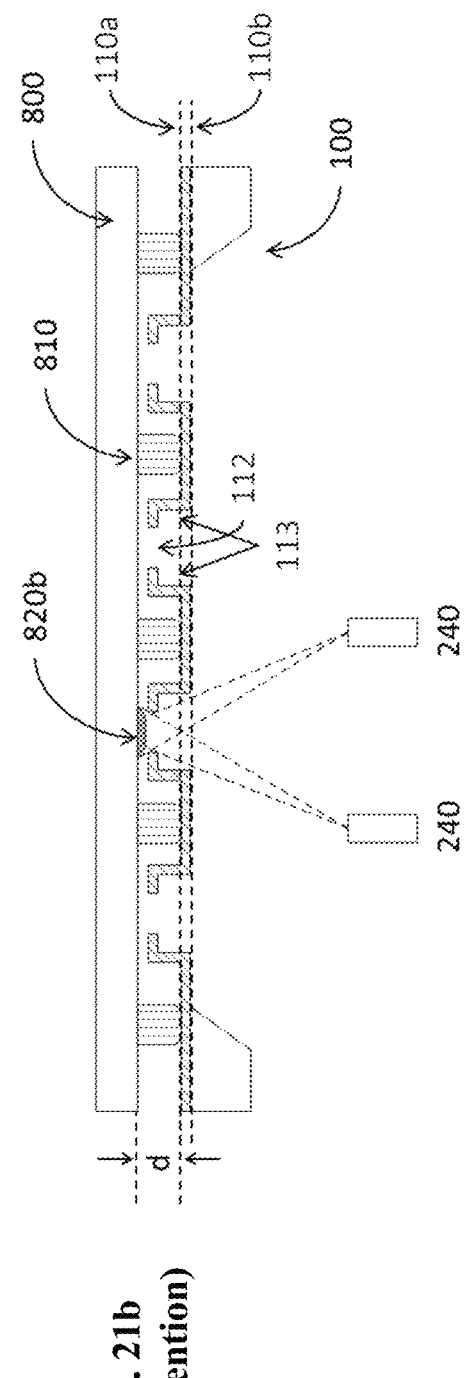

The different corrugation structure of the present invention brings about completely different vapor deposition processes and results from the prior art shadow masks. As depicted in FIG. 21a, when a gap d is established between the upper membrane plane 710a of mask 700 and a deposition substrate 800 by spacers 810, the spacing between aperture 712 and 800 is not reduced by corrugation 713. As a result, the material film 820a deposited by deposition source 240 through aperture 712 is expanded in diameter, highly non-uniform in thickness, and completely not usable for making devices, particularly devices that require adjacent deposition of different materials, as in forming an array of pixel materials. The corrugation 713, which is recessed from the membrane planes and therefore closer to deposition source 240 than the flat portion of membrane 710, may have a detrimental impact by blocking some of the vaporized materials, further obscuring deposited material film 820a.

In contrast, when the same gap d is established between the inventive membrane plane 110a of mask 100 and a deposition substrate 800 by spacers 810, the spacing between aperture 112 and 800 is greatly reduced by the corrugation 113. The deposited material film 820b has a diameter mostly replicating the opening of aperture 112, is largely uniform in thickness, and is highly suitable for making devices, including arrays of pixels. Similar to the scenarios in FIG. 3, the corrugated membrane 110 can reduce color mixing when patterning RGB subpixel arrays, but the corrugated membrane 710 in the prior art cannot reduce such color mixing.

In an aspect, the protruding corrugation 113 and elevated aperture 112 in the corrugated shadow mask 100 reduce the spacing between the mask and a deposition substrate, distinguishing the present invention from conventional flat masks and prior arts.

The composition and dimensions of each component of the present shadow mask are described in the following.

Membrane 110

Membrane 110 is typically under tensile stress and includes at least one of silicon nitride, silicon oxynitride with an atomic ratio of oxygen less than 30%, and aluminum oxide. The composition, forming method, and dimensions of membrane 110 may be optimized such that the tensile stress of 110 is large enough to tension the central membrane region 111 against gravity but small enough not to deform the peripheral support 120 to a large extent. In an embodiment, membrane 110 is silicon nitride. The thickness of the membrane 110 is less than 5 μm. In a preferred embodiment, the thickness of the membrane 110 is 2 μm or less, but 0.01 μm or more. In a further preferred embodiment, the thickness of the membrane 110 is 1 μm or less, but 0.1 μm or more. The membrane 110 covers the top of the peripheral support 120. In an embodiment, membrane 110 covers part of the top surface of the peripheral support 120. In another embodiment, membrane 110 covers the entire top surface of the peripheral support 120. In still another embodiment, membrane 110 covers the entire top surface and all the side surfaces of the peripheral support 120.

Membrane 110 may be a multilayer structure. In some embodiments, membrane 110 has a first ceramic layer and a second ceramic layer of different compositions. The first and second ceramic layers may be silicon nitride, silicon oxide, or silicon oxynitride. In some embodiments, membrane 110 has a first ceramic layer, a second ceramic layer, and an interlayer between the first and second ceramic layers. The interlayer may be a resin or a ferromagnetic material. The interlayer may cover the entire first ceramic layer or only parts of it. In some embodiments, the interlayer is polyimide, Fe, Ni, or a Fe—Ni alloy. The interlayer may form parts of the corrugations 113 or introduce additional corrugations.

Apertures 112

The membrane 110 contains a plurality of apertures 112. In an embodiment, the apertures 112 are in the free-standing, central region 111 of the membrane 110, allowing material vapor to pass through. In another embodiment, the apertures 112 may be in the supported, peripheral region 114 and the free-standing, central region 111 of the membrane 110. The apertures 112 in the supported region 114 can reduce the force exerted on the mask by the membrane 110. The apertures 112 can take any shape. In one embodiment, the apertures 112 are circular or elliptical. In another embodiment, the apertures 112 are rectangular or rounded-corner rectangular. In still another embodiment, the apertures 112 are polygonal. The aperture array can take any particular pattern. In an embodiment, the apertures 112 are arranged in a rectangular lattice. In another embodiment, the apertures 112 are arranged in a square lattice. In still another embodiment, the apertures 112 are arranged in a hexagonal lattice. One or more apertures 112 in the free-standing region 111 of the membrane 110 have at least one dimension smaller than 10 μm. In one embodiment, one or more apertures 112 in the free-standing region 111 of the membrane 110 have every dimension smaller than 10 μm. In another embodiment, one or more aperture 112 in the free-standing region 111 of membrane 110 has at least one dimension smaller than 5 μm. In still another embodiment, one or more apertures 112 in the free-standing region 111 of the membrane 110 have every dimension smaller than 5 μm. These apertures 112 occupy a certain percentage of the total area of the free-standing membrane. In an embodiment, the percentage is larger than 10%. In another embodiment, the percentage is between 10% and 50% of the total area. The exit opening 112a may be larger than, equal to, or smaller than the entrance opening 112b. In an embodiment, 112a is larger than 112b. There may be one or more openings between 112a and 112b that are smaller than either one of them. It is noted that the membrane 110 and its apertures 112 may be custom fabricated to produce arbitrary patterns of pixels. Thus, the membrane and its apertures may be made to correspond to any pattern of periodic pixels to be fabricated by vapor deposition.

Corrugations 113

Figure 10:
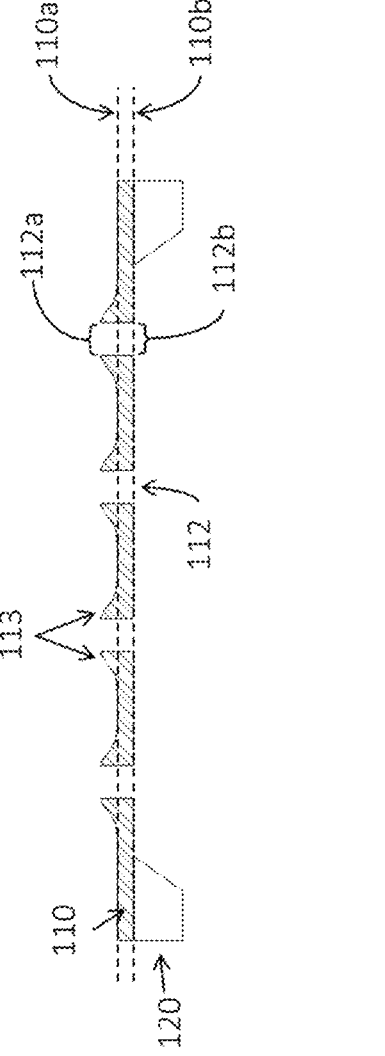
FIG. 10 schematically depicts the cross-sectional view of a shadow mask according to an embodiment, where the top surface of the membrane is corrugated while the bottom surface of the membrane is flat.

Membrane 110 has corrugations 113 with through-apertures 112 situated at the apexes of each corrugation such that the exit opening 112a projects from membrane regions surrounding 112a and from the upper membrane plane 110a. In some embodiments, the upper edge of exit opening 112a fully projects from the upper membrane plane 110a. In some embodiments, only a portion of the upper edge of exit opening 112a, e.g., two opposing sides of a rectangular exit opening 112a out of all four sides, projects from the upper membrane plane 110a. In some embodiments, different sections of the upper edge of 112a project from the upper membrane plane 110a to different heights. The pattern of corrugation 113 may follow the display backplane's pixel arrangement and surface morphology. Corrugations 113 may have a periodic structure. In some embodiments, the cross-section of the corrugation approximately follows a sinusoidal, rectangular, trapezoidal, or triangle waveform in whole or in part. These waveforms may be clipped, rectified, mixed, or transformed so that the corrugated membrane 110 may better accommodate the surface morphology of the display backplane or the geometry of shadow mask 100. The embodiments in FIGS. 9a-9e illustrate shadow masks of membrane 110 having corrugations 113 that follow a rectified sinusoidal, a full sinusoidal, a rectangular, a rectified triangular, and a trapezoidal waveform, respectively. Membrane areas at the apexes of the waveform are perforated to form through-apertures 112. Corrugation 113's pitch (the distance between two adjacent apexes) and height (the perpendicular displacement between the corrugation's highest point and lowest point) may vary according to the arrangement of pixels and projections on the display backplane. In some embodiments, the pitch of corrugation 113 is approximately 20 μm or less. In some embodiments, the pitch of 113 is approximately 10 μm or less. In some embodiments, the height of each apex of 113 is approximately 20 μm or less. In some embodiments, the height of each apex 113 is 5 μm or less. In some embodiments, the height of each apex 113 is 2 μm or less. In some embodiments, only the top surface of membrane 110 is corrugated, and the exit opening 112a projects beyond the upper membrane plane 110a, while the bottom surface of membrane 110 is flat, and the entrance opening 112b is in the lower membrane plane 110b, as illustrated in FIG. 10.

Figure 11:
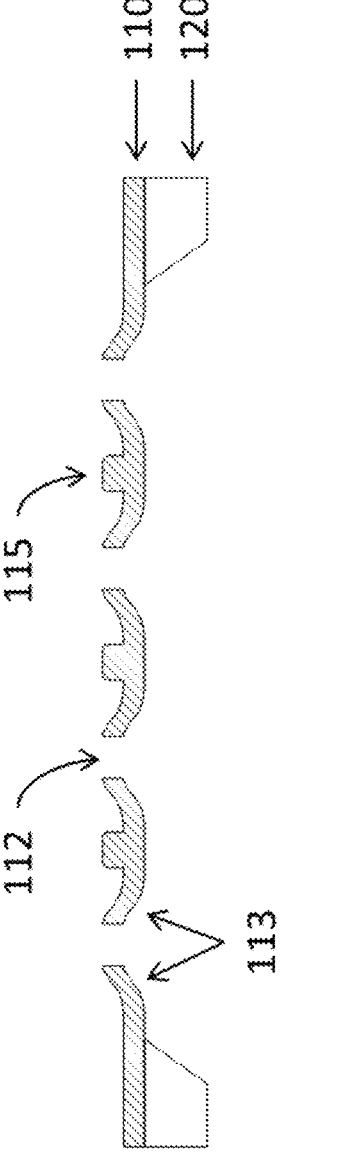
FIG. 11 schematically depicts the cross-sectional view of a shadow mask according to an embodiment with additional corrugation between through-apertures.

The membrane areas between apertures 112 may have projecting corrugations. The embodiment in FIG. 11 shows a membrane 110 with additional corrugations 115 in the membrane areas between apertures 112. Additional corrugations 115 may function as contact points for the display backplane during shadow masking so that the display backplane may have reduced or down-sized geometrical spacers or not need spacers at all. In an embodiment, the highest point of 115 is equal to or higher than that of 112; that is the height of additional corrugations 115 is equal to or larger than the height of the apexes of corrugations 113.

Figures 12A, 12B, 12C:
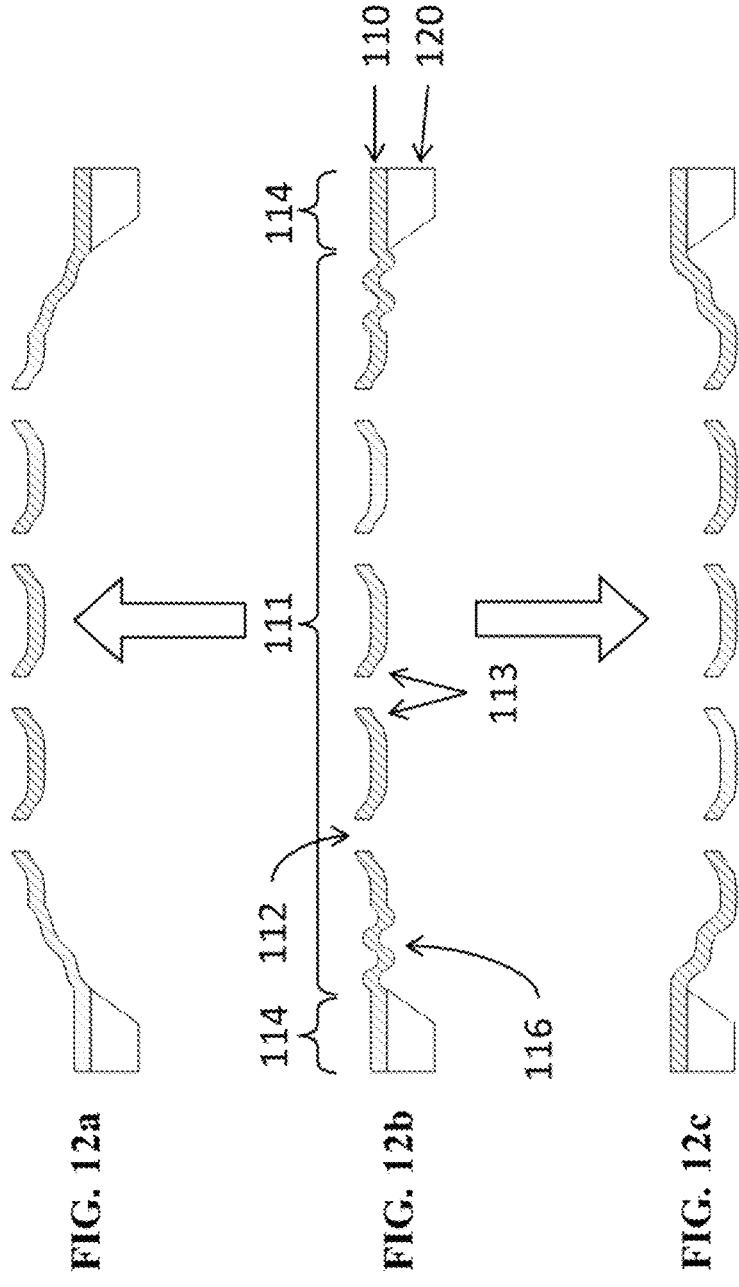
FIGS. 12a-12c schematically depict a shadow mask according to an embodiment with the central membrane region having a corrugated area without apertures surrounding the area with apertures.
Figures 13A, 13B, 13C:
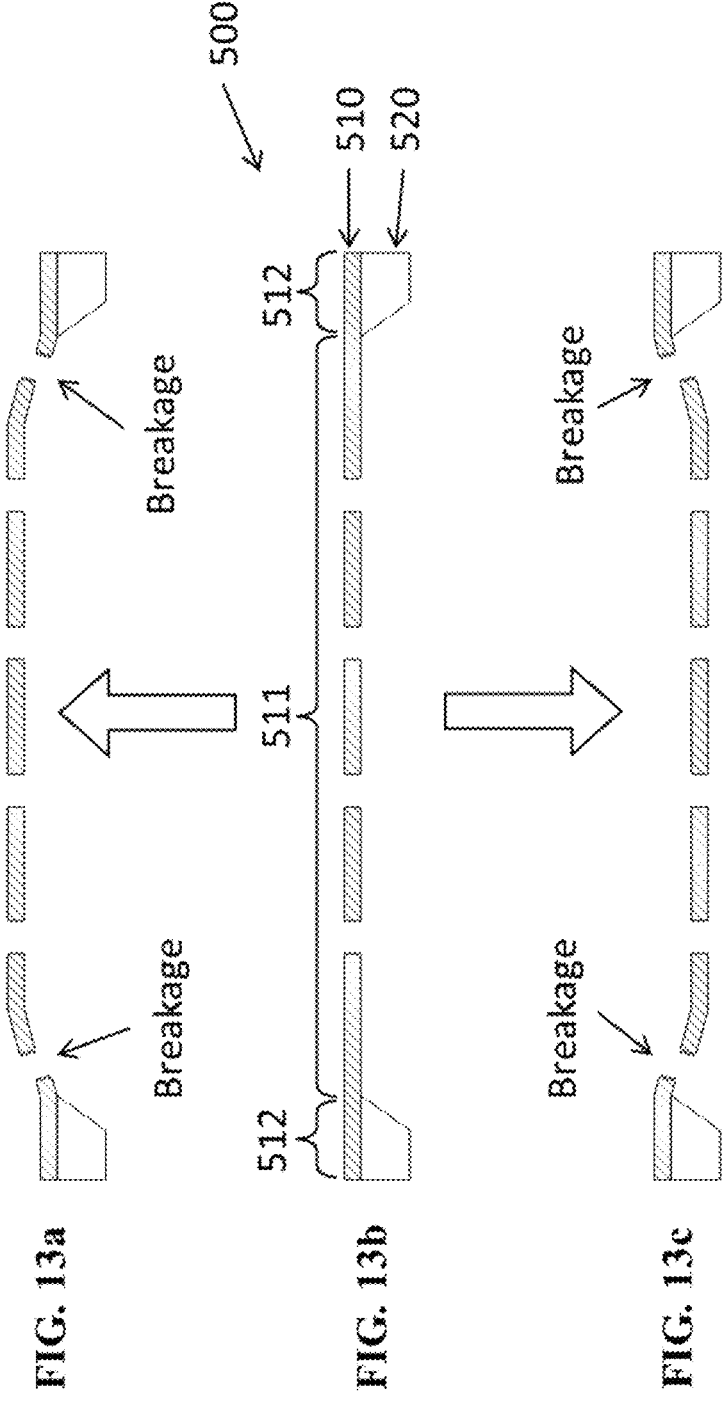
FIGS. 13a-13c schematically depict a flat shadow mask having the membrane broken under external forces.

The central membrane region 111 may have a corrugated area without apertures along the edge of 111, surrounding the area with apertures. As shown in FIG. 12b, central membrane region 111 has edge corrugation 116 along its perimeter adjacent to the peripheral membrane region 114. Edge corrugation 116 may increase the membrane 110's robustness against out-of-plane displacement. As shown in FIGS. 12a and 12c, when the central region 111 is perpendicularly displaced by an external force, and central region 111's edge stretched, edge corrugation 116 provides redundancy and avoids the rupture of membrane 110 along the boundary between 111 and 114. Additionally, both corrugations 113 and 116 may reduce the in-plane tensile stress of membrane 110, as these corrugations interrupt the in-plane continuity of such stress. The stress reduction further improves membrane 110's mechanical strength against deformation. In contrast, a flat membrane 510 within a shadow mask 500, as shown in FIGS. 13a-13c, is less robust than a corrugated membrane and prone to rupture, particularly along the boundary between the central region 511 and a peripheral region 512 when central region 511 is displaced off the plane (FIG. 13c).

Figures 14A, 14B:
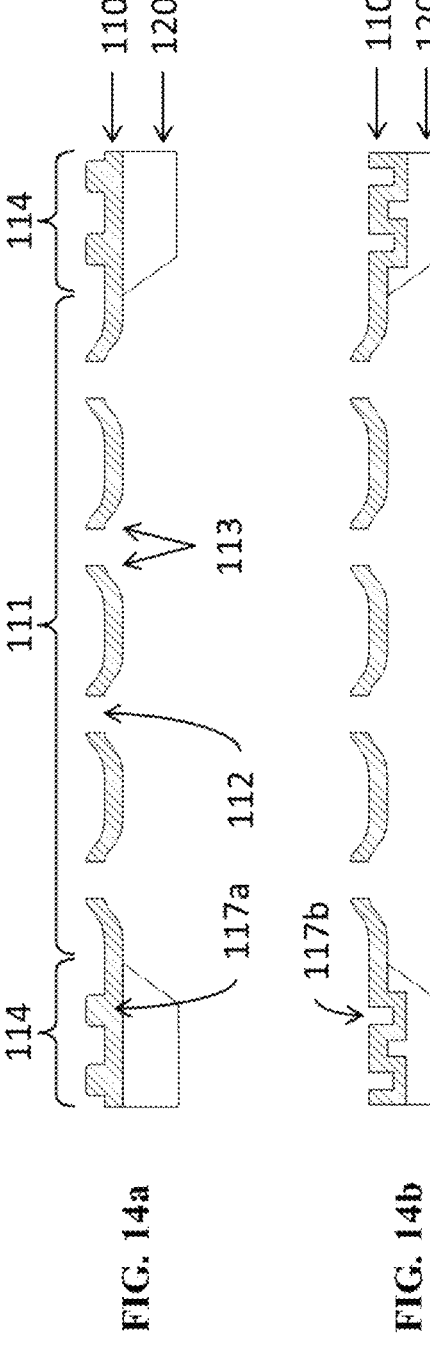
FIGS. 14a and 14b schematically depict the cross-sectional view of shadow masks according to embodiments with corrugation in the peripheral membrane area.

The peripheral membrane region 114 may be corrugated. As shown in FIG. 14, peripheral membrane region 114 may have periodic projections 117a or cavities 117b, following waveforms independent of corrugations 113 in the central membrane region 111. Periodic projections 117a or cavities 117b may lower the membrane stress in peripheral membrane region 114 and interrupt the spread of any membrane fractures formed in the growth of membrane 110 and subsequent fabrication processes to form mask 100.

Figures 15A, 15B, 15C:
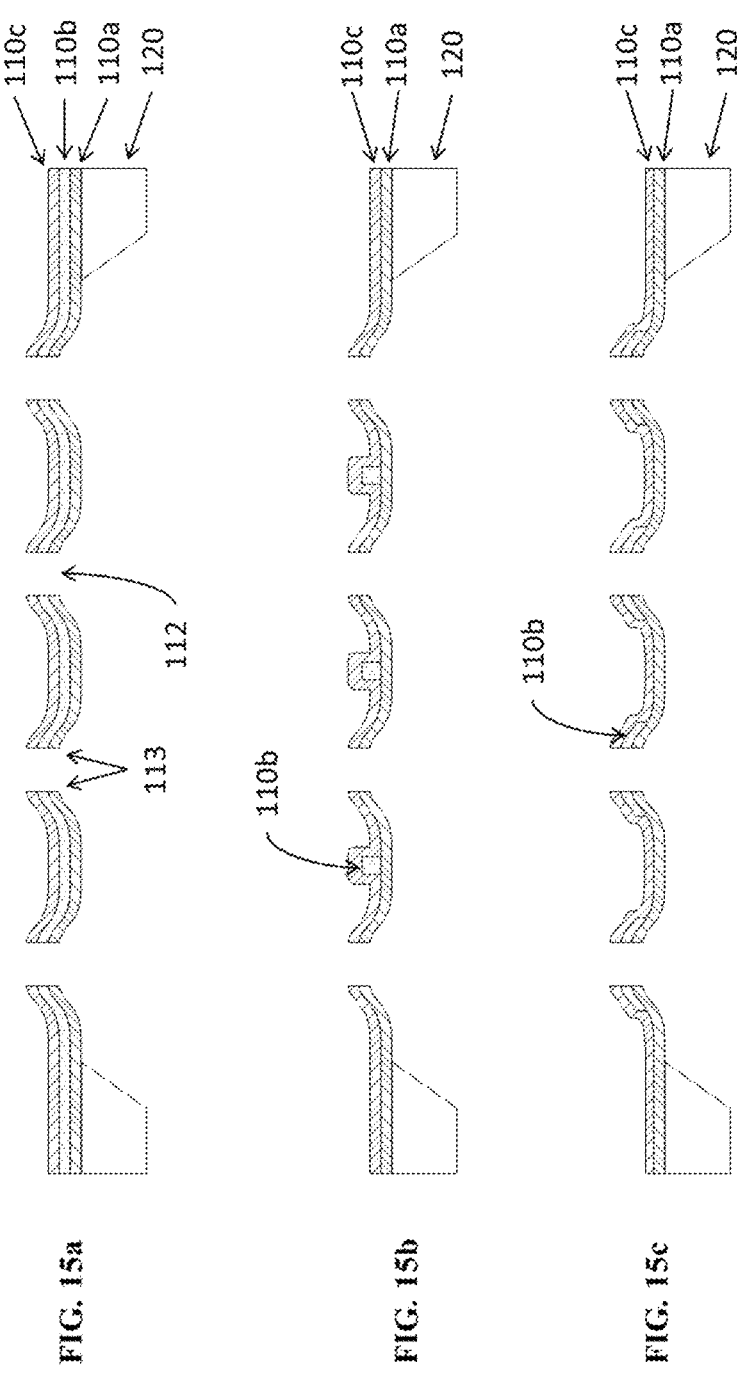
FIGS. 15a-15c schematically depict the cross-sectional views of shadow masks according to embodiments, where the membrane is a multilayer.

Membrane 110 may be a multilayer structure. As shown in FIGS. 15a-15c, membrane 110 may comprise a first layer 110a establishing the bottom surface of the membrane, an interlayer 110b on top of the first layer, and a second layer 110c on top of the interlayer establishing the top surface of the membrane. Interlayer 110b may cover the entire surface of 110a (FIG. 15a) or only part of it (FIGS. 15b-c). Interlayer 110b may introduce additional corrugations (FIG. 15b) or form part of the corrugations 113 (FIG. 15c).

FIGS. 16a-d illustrate some examples of the arrangements of interlayer 110b on top of 110a. In some embodiments, the first and second layers are ceramic and may include silicon nitride, silicon oxide, or silicon oxynitride, and the interlayer is a resin or a ferromagnetic material. In some embodiments, the interlayer is polyimide, Fe, Ni, or Fe—Ni alloy. The combined thickness of layers 110a-c is 5 µm or less. The thickness of the interlayer 110b is 2 µm or less. In a preferred embodiment, the thickness of 110b is 1 µm or less, but approximately 0.1 µm or more.

Peripheral Support 120

Peripheral support 120 provides mechanical support to the membrane 110 and includes one of silicon, polycrystalline silicon, quartz, and glass. In an embodiment, peripheral support 120 is silicon. Peripheral support 120 can take any shape. In one embodiment, peripheral support 120 takes the shape of standard silicon wafers used in semiconductor manufacturing. The hollow region 130 of the shadow mask defines the boundaries of the central region 111 of the membrane 110 and can take any shape. In an embodiment, the hollow region 130 is rectangular. In another embodiment, the hollow region 130 is square. The size of the hollow region determines the size of the area that can be patterned each time using the present shadow mask. In an embodiment, the hollow region 130 has at least one dimension larger than 1 inch. In another embodiment, the hollow region 130 has at least one dimension larger than 2 inches. In still another embodiment, the hollow region 130 has at least one dimension larger than 5 inches.

Figure 17:
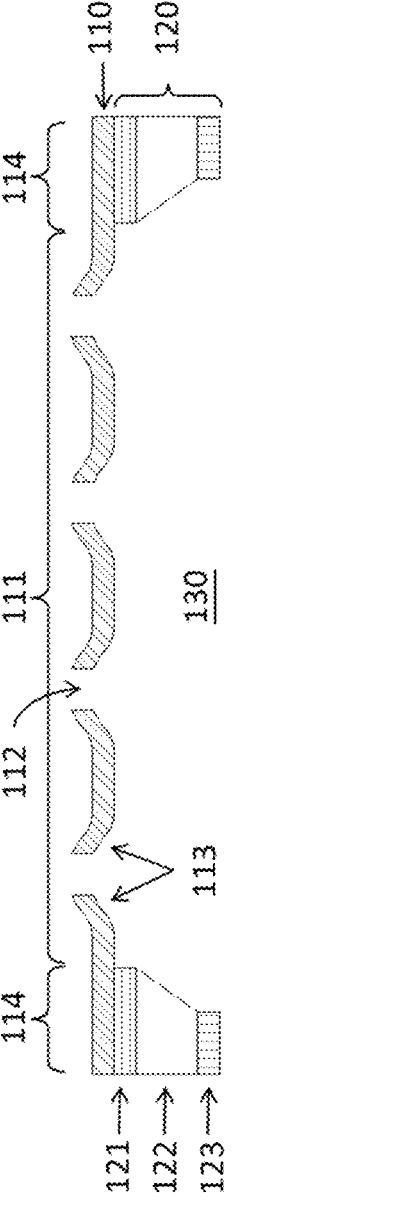
FIG. 17 schematically depicts a shadow mask's cross-sectional view according to an embodiment, where the peripheral support is a multilayer.

Peripheral support 120 may be multilayer and comprise a top layer 121, a base layer 122, and a lower layer 123, as shown in FIG. 17. The top layer 121 is located between the supported peripheral region 114 of the membrane 110 and the solid region of the base layer 122. The lower layer 123 is located on the opposite side of the base layer 122 with respect to the membrane 110. Layers 121 and 123 may function as stress balancing layers to maintain the overall structure of the mask in a planar, flat condition. In some embodiments, layer 121 is under compressive stress, and layer 123 is under tensile stress. Factors that can selectively tune the stress of 121 and 123 are selection of materials, optional dopants, optional compositional changes (e.g., off-stoichiometric compositions), fabrication techniques (e.g., substrate bias during high-energy deposition processes such as sputtering, plasma-enhanced CVD, or atomic layer deposition (ALD), etc.). It is noted that when the compositions are recited in the specification and claims, it is understood that these nominal compositions include off-stoichiometric compositions and also include doped compositions, even when not explicitly recited. There can be more than one top layer 121 between the membrane 110 and the base layer 122 or more than one lower layer 123 under the base layer 122.

The top layer 121 comprises at least one of silicon oxide, silicon oxynitride with an atomic ratio of oxygen larger than 30%, oxides of different elements, amorphous silicon, polycrystalline silicon, metal like nickel, iron, or nickel-iron alloy, and polymers such as parylene, polyimide or PMMA. In an embodiment, the top layer 121 comprises silicon oxide. In an embodiment, the thickness of the top layer 122 is 5 µm or less. In another embodiment, the thickness of the top layer 122 is 2 µm or less. In still another embodiment, the thickness of the top layer 122 is 1 µm or less. In still another embodiment, the thickness of the top layer 122 is 0.5 µm or less.

The lower layer 123 includes at least one of silicon nitride, silicon oxynitride with the atomic ratio of oxygen less than 30%, oxides of different elements such as aluminum oxide, metals such as nickel, iron, or nickel-iron alloys, and polymers such as parylene, polyimide or PMMA. In an embodiment, the lower layer 123 is silicon nitride. In an embodiment, the thickness of the lower layer 123 is 5 µm or less. In another embodiment, the thickness of the lower layer 123 is 2 µm or less. In still another embodiment, the thickness of the lower layer 123 is 1 µm or less. In still another embodiment, the thickness of the lower layer 123 is 0.5 µm or less.

In another aspect, the present disclosure provides a method to make the disclosed shadow mask. The general fabrication process flow of this method is illustrated in FIGS. 18a-18e and is described in the following steps. Note that the steps below are for illustration only and, in some aspects, may be performed in a different order, or multiple steps may be performed simultaneously.

The fabrication starts with a clean, blank substrate 601 acting as a base layer (FIG. 18a), such as a double-side polished silicon wafer. A corrugated surface 602 (FIG. 18b) is formed on 601 such that the areas to face the through-apertures 112 are at the apexes of the corrugation. Corrugated surface 602 may be formed by photolithography and etching of substrate 601. In some embodiments, substrate 601 is silicon, and depending on the shape of the corrugation, corrugated surface 602 may be formed by anisotropic etching techniques, such as reactive ion etching (RIE), deep reactive ion etching (DRIE), TMAH (tetramethylammonium hydroxide) etch, and KOH (potassium hydroxide) etch, or isotropic etching techniques, such as XeF plasma etch and HNA (hydrofluoric nitric acetic acid) wet etch. In some embodiments, substrate 601 is silicon, and corrugated surface 602 is formed by local oxidation of substrate 601 and subsequent removal of the formed silicon oxide. A pristine membrane layer 603 is deposited on the corrugated surface 602 (FIG. 18c), such that membrane layer 603 follows the same corrugation of 602. In an embodiment, membrane 603 comprises silicon nitride and is deposited by chemical vapor deposition (CVD). In another embodiment, membrane 603 comprises low-stress silicon nitride and is deposited by low-pressure chemical vapor deposition (LPCVD). Other techniques such as plasma-enhanced CVD or atomic layer deposition (ALD) may be selected depending upon the desired level of stress in the membrane layer, which may be tuned through deposition techniques and composition selections. Apertures 112 are then patterned and perforated on the pristine membrane layer 603 at the apexes of the corrugation via photolithography and etching to produce perforated membrane 110 (FIG. 18d). In one embodiment, the apertures 112 are perforated by RIE or DRIE with multiple ME and passivation cycles. In another embodiment, the apertures 112 are perforated by wet etching. Following the aperture perforation step, a portion of the substrate 601 is then etched through, forming 120 as the peripheral support and a hollow region 130 under the membrane 110 (FIG. 18e). The substrate 601 can be etched through using KOH etch, TMAH etch, or DRIE.

The fabrication process may involve additional steps when membrane 110 or peripheral support 120 is a multilayer. In some embodiments, the membrane 110 comprises a first layer 110a, an interlayer 110b, and a second layer 110c, and precursor layers to 110a-c are formed on the corrugated surface 602 sequentially before they are perforated to form 110a-c. In some embodiments, the peripheral support 120 comprises a top layer 121, a base layer 122, and a lower layer 123. A precursor layer to 121 may be formed on the corrugated surface 602 before forming 603 and etched to form 121 after the through-etch of substrate 601. The precursor layer to layer 121 may serve as a etch stop layer in the through-etch of substrate 601 and a protective layer for membrane 110. A precursor layer to 123 may be formed on the opposite side of substrate 601 and etched to form 123 before removing any part of substrate 601. Layer 123 may serve as a hard etching mask for the through-etch of substrate 601.

The produced shadow mask can be used as fabricated on the original substrate or further diced out with a desired peripheral support width and peripheral support shape. When used to produce patterned layouts of materials, the disclosed shadow masks can be directly or indirectly connected to a mechanical alignment mechanism. The disclosed shadow masks can also be used as a complete shadow-masking assemblage by mechanically or physically attaching several masks to a fixture or module, such as a metal carrier, to pattern layouts on larger-area substrates. During the shadow mask patterning process, the substrate to be patterned can be placed in proximity to or in contact with the disclosed shadow masks.

Example 1

This example describes the fabrication procedure of a shadow mask of the disclosed structure following the disclosed method.

Figures 19A, 19B, 19C, 19D, 19E, 19F:
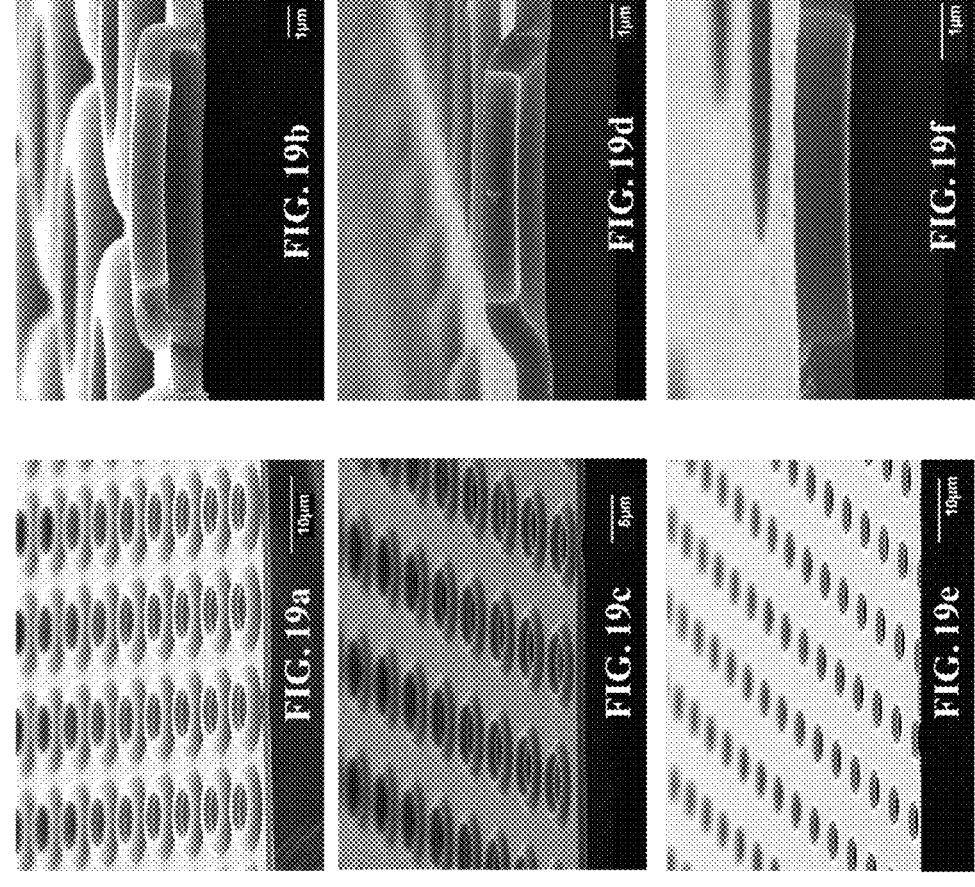
FIGS. 19a-19f are SEM photographs of shadow masks fabricated in Example 1 (19a and 19b), Examples 2 (19c and 19d), and Comparative Example (19e and 19f).

A 4-inch double-side polished silicon wafer with a thickness of 400 μm was used as the starting substrate to fabricate the shadow mask. After cleaning by DI water and 120° C. sulfuric acid solution ($H_2SO_4/H_2O_2=10/1$) successively, the wafer was dipped into room temperature HF solution for 1 min to remove native oxide. A photoresist was spin-coated on the front side of the wafer, and a pattern that defines the corrugation on the substrate was transferred onto the photoresist layer from a photomask by contact photolithography. The front side of the wafer was etched by DRIE to form a corrugated surface. After removing the photoresist, the wafer was transferred into a furnace to grow 8500 Å silicon oxide (SiOx) at 1100° C. on both sides of the wafer. The SiOx on the backside of the wafer was removed by an oxide etchant. Next, 1 μm silicon nitride (SiNx) was deposited on both sides of the wafer in an LPCVD furnace. Then photoresist was spin-coated on the front side, and a pattern that defines the apertures in the membrane was transferred onto the photoresist layer from a photomask by contact photolithography. The apertures in the SiNx layer were subsequently perforated by RIE with the patterned photoresist as a hard mask. After removing the photoresist on the front side, the backside of the wafer was coated with a photoresist, followed by transferring a pattern, which defines the free-standing area of the membrane, to the backside SiNx layer using the same photolithography and dry etching processes as the front side. Then the wafer was cleaned with 120° C. sulfuric acid solution before soaking it into 25% TMAH solution to etch through the bulk silicon with the SiNx on the backside as a hard mask. After the Si underneath the free-standing region of the membrane was completely etched away, the wafer was taken out of the TMAH bath and dipped into oxide etchant to remove the SiOx under the SiNx membrane within the free-standing area to finish the fabrication. As shown in FIG. 19 the final shadow mask comprises a 1 μm SiNx membrane with a 35×35 mm² free-standing region and a peripheral support with 0.85 μm SiOx as the top layer, 400 μm Si as the base layer, and 1 μm SiNx as the lower layer. As shown in FIGS. 19a-19b, the perforated apertures in the free-standing region of the SiNx membrane are circular of 6 μm in diameter and arranged in a square lattice with a pitch of 12.7 μm, forming an array that can pattern a pixel array of 2000 PPI. The membrane's cross-section through the aperture follows a square-like corrugation with a height about 1.2 μm and an apex width of 9 μm.

Example 2

A shadow mask was produced in the same fashion as Example 1, except that the corrugated surface is formed by a different method of the following steps. After native oxide removal, 1) 90 nm thick SiNx was deposited on both sides of the wafer by LPCVD; 2) photolithography and RIE were performed on the front side of the wafer, creating a SiNx array as a hard mask to define the corrugation; 3) the wafer was transferred into a furnace to grow 2 μm silicon oxide (SiOx) at 1100° C. on the front side of the wafer; 4) the grown SiOx and SiNx on both sides of the wafer were then removed successively in oxide etchant and nitric acid, leaving a corrugated surface on the front side of the wafer. The rest of the steps to form the shadow mask are the same as Example 1. In the resulting shadow mask, the membrane's cross-section through the aperture follows a half sinusoidal-like corrugation with a height about 0.9 μm, as shown in FIGS. 19c-19d.

Comparative Example

A shadow mask was produced in the same fashion as Example 1, except that no corrugation was formed on the front side of the wafer. In the resulting shadow mask, the membrane's cross-section through the aperture is flat without any corrugation.

The SEM images of the shadow mask from Example 1, Example 2, and Comparative Example are summarized in FIGS. 19a-f. Example 1 (FIGS. 19a-b) shows a square wave-like corrugation with a height of 1.2 μm. Example 2 (FIGS. 19c-d) shows a half sinusoidal wave-like corrugation with a height of 0.9 μm. Comparative Example shows a flat cross-section through the through-apertures. The gap between these masks and a deposition substrate was calculated by the offset between two patterns deposited by two point sources from oblique angles. The results are summarized in Table 1. When these shadow masks are put into direct contact with a flat substrate, the average gap between the through-aperture's exit opening and the device substrate is measured to be 0.4 μm for Example 1, 0.7 μm for Example 2, and 1.0 μm for Comparative Example. When these shadow masks are put into direct contact with a substrate with 2.5 μm spacers, the average gap between the through-aperture's exit opening and the device substrate is measured to be 1.7 μm for Example 1, 2.3 μm for Example 2, and 2.7 μm for Comparative Example. The corrugation in Examples 1 and 2 reduced the gap between the through-aperture's exit opening and the device substrate, lowering the shadowing effect.

TABLE 1

|  | Height of corrugation (μm) | Gap between the shadow mask and a flat substrate (μm) | Gap between the shadow mask and a substrate with 2.5 μm spacers (μm) |
|---|---|---|---|
| Example 1 | 1.2 | 0.4 | 1.7 |
| Example 2 | 0.9 | 0.7 | 2.3 |
| Comparative Example | 0 | 1.0 | 2.7 |

In an aspect, the disclosed shadow mask can be used to pattern materials evaporated from a single source or co-evaporated from multiple sources. In particular, the shadow mask with a corrugated membrane can reduce the spacing between the shadow mask and the substrate to be patterned and realize high-quality, micron-scale material patterning with significantly reduced shadowing effect. This ability is particularly important in patterning OLED materials, as the reduced shadowing effect will lead to increased pixel density and a larger pixel aperture ratio. In an embodiment, the disclosed shadow mask is used to pattern materials used in an OLED device. In another embodiment, the disclosed shadow mask is used to pattern materials used in the light-emitting layers of an OLED device.

In an aspect, the present disclosure provides a shadow mask with a corrugated membrane for producing patterned layouts during vapor deposition of thin films and a method for making the same. The structures of the disclosed shadow mask, the components and combinations thereof, and the fabrication methods are described herein. In various embodiments, the shadow mask comprises one or more components described herein, and the method to produce the shadow mask comprises one or more processes described herein.

The many aspects, embodiments, and examples disclosed here are exemplary and not limiting. After reading this specification, skilled artisans appreciate that other aspects and embodiments are possible without departing from the scope of the invention. Other features and benefits of any one or more of the embodiments will be apparent from the detailed description and from the claims.

The invention claimed is:

1. A shadow mask for patterned vapor deposition comprising:
   a corrugated membrane having a central membrane region including plural periodic corrugations, the corrugated membrane including a base membrane plane where each corrugation has an apex that projects beyond a surrounding of the base membrane plane, each apex includes a through-aperture, and is oriented away from a peripheral support, each corrugation is positioned in the central membrane region remote from a peripheral support, the periodic corrugations with apex through-apertures forming an aperture array in the central membrane region through which a vaporized deposition material can pass, where each apex projects beyond the surrounding base membrane plane by a height of approximately 5 µm or less; and
   a peripheral membrane region surrounding the central membrane region that includes the peripheral support attached to a rear surface of the peripheral membrane region, with a hollow portion beneath the central membrane region.

2. The shadow mask of claim 1, wherein the corrugated membrane is ceramic, metallic, elemental, or polymeric.

3. The shadow mask of claim 1, wherein the corrugated membrane is ceramic.

4. The shadow mask of claim 3, wherein the corrugated membrane includes one or more of silicon nitride, silicon oxide, or silicon oxynitride.

5. The shadow mask of claim 2, wherein the peripheral support includes one or more of single crystalline silicon, polycrystalline silicon, quartz, glass, metal, or polymer.

6. The shadow mask of claim 1, wherein the peripheral support is a multilayer peripheral support.

7. The shadow mask of claim 6, wherein the multilayer peripheral support includes at least a first layer that includes single crystalline silicon, polycrystalline silicon, quartz, glass, metal, or polymer.

8. The shadow mask of claim 7, wherein the multilayer peripheral support includes a second layer beneath the first layer that includes silicon nitride, silicon oxynitride with an atomic ratio of oxygen less than 30%, aluminum oxide, metal, or polymer.

9. The shadow mask of claim 8, wherein the multilayer peripheral support includes a third layer above the first layer that includes silicon nitride, silicon oxynitride with an atomic ratio of oxygen less than 30%, aluminum oxide, metal, or polymer.

10. The shadow mask of claim 1, wherein a thickness of the corrugated membrane is 10 microns or less.

11. The shadow mask of claim 1, wherein a thickness of the corrugated membrane is 1 micron or less.

12. The shadow mask of claim 1, wherein the plural periodic corrugations are approximately sinusoidal waveform, rectangular waveform, trapezoidal waveform, or triangular waveform.

13. The shadow mask of claim 1, wherein the periodic corrugations are on a top surface.

14. The shadow mask of claim 13, wherein the corrugated membrane is a multilayer corrugated membrane that includes first and second layers including silicon nitride, silicon oxide, or silicon oxynitride, and a polymeric or metallic interlayer between the first and second layers.

15. The shadow mask of claim 14, wherein the interlayer is ferromagnetic.

16. The shadow mask of claim 1, wherein the central membrane region further includes a set of additional corrugations in membrane regions between adjacent apertures.

17. The shadow mask of claim 1, wherein the central membrane region has a corrugated area without apertures along an edge of the central membrane region, surrounding the aperture array in the central membrane region.

18. The shadow mask of claim 1, wherein the peripheral membrane region is corrugated.

19. A method for making the shadow mask of claim 1, comprising:
   forming a corrugated surface on a blank substrate;
   depositing one or more ceramic membrane layers on the corrugated surface of the blank substrate;
   patterning apertures in the one or more ceramic membrane layers at apexes of corrugations;
   removing a portion of the blank substrate beneath a central region of the one or more ceramic membrane layers to form an unsupported central region and a supported peripheral region.

20. The method for making the shadow mask according to claim 19, wherein forming the corrugated surface on the blank substrate is by etching.

21. The method for making the shadow mask according to claim 19, wherein depositing the one or more ceramic membrane layers on the corrugated surface of the blank substrate is by chemical vapor deposition, plasma-enhanced chemical vapor deposition, or atomic layer deposition.

22. The method for making the shadow mask according to claim 19, wherein the apertures are formed by reactive ion etching, deep reactive ion etching, or wet etching.

23. The method for making the shadow mask according to claim 19, wherein the portion of the blank substrate is removed by wet etching or deep reactive ion etching.

* * * * *